US010125289B2

(12) United States Patent
Sugiyama et al.

(10) Patent No.: US 10,125,289 B2
(45) Date of Patent: Nov. 13, 2018

(54) COMPOSITION FOR INTERLAYER FILLER OF LAYERED SEMICONDUCTOR DEVICE, LAYERED SEMICONDUCTOR DEVICE, AND PROCESS FOR PRODUCING LAYERED SEMICONDUCTOR DEVICE

(71) Applicant: MITSUBISHI CHEMICAL CORPORATION, Tokyo (JP)

(72) Inventors: Masaya Sugiyama, Kitakyushu (JP); Yasuhiro Kawase, Kitakyushu (JP); Makoto Ikemoto, Kitakyushu (JP); Hideki Kiritani, Kitakyushu (JP); Masanori Yamazaki, Yokohama (JP)

(73) Assignee: Mitsubishi Chemical Corporation, Tokyo (JP)

(*) Notice: Subject to any disclaimer, the term of this patent is extended or adjusted under 35 U.S.C. 154(b) by 167 days.

(21) Appl. No.: 14/859,526

(22) Filed: Sep. 21, 2015

(65) Prior Publication Data
US 2016/0009947 A1 Jan. 14, 2016

Related U.S. Application Data

(63) Continuation of application No. PCT/JP2014/059139, filed on Mar. 28, 2014.

(30) Foreign Application Priority Data

Mar. 28, 2013 (JP) ................................. 2013-070084
Dec. 25, 2013 (JP) ................................. 2013-267644
Mar. 24, 2014 (JP) ................................. 2014-060707

(51) Int. Cl.
*C09D 163/00* (2006.01)
*C08L 63/00* (2006.01)
*C08K 3/36* (2006.01)
*C08K 3/38* (2006.01)
*C08K 3/22* (2006.01)
*C08K 3/28* (2006.01)
*C08K 5/18* (2006.01)
*C08K 5/42* (2006.01)
*H01L 23/00* (2006.01)
*C08G 59/50* (2006.01)

(52) U.S. Cl.
CPC ....... *C09D 163/00* (2013.01); *C08G 59/5033* (2013.01); *C08K 3/22* (2013.01); *C08K 3/28* (2013.01); *C08K 3/36* (2013.01); *C08K 3/38* (2013.01); *C08K 5/18* (2013.01); *C08K 5/42* (2013.01); *C08L 63/00* (2013.01); *H01L 24/29* (2013.01); *H01L 24/83* (2013.01); *C08K 2003/222* (2013.01); *C08K 2003/2227* (2013.01); *C08K 2003/282* (2013.01); *C08K 2003/385* (2013.01); *H01L 2224/2919* (2013.01); *H01L 2224/83201* (2013.01); *H01L 2224/83948* (2013.01); *H01L 2924/3512* (2013.01)

(58) Field of Classification Search
CPC ........................... C08G 59/5033; C09D 163/00
See application file for complete search history.

(56) References Cited

U.S. PATENT DOCUMENTS

| | | | |
|---|---|---|---|
| 2004/0247882 A1 | 12/2004 | Kouchi et al. | |
| 2007/0104960 A1* | 5/2007 | Asano .............. | C08G 59/38 428/413 |
| 2008/0108761 A1 | 5/2008 | Kouchi et al. | |
| 2009/0044727 A1* | 2/2009 | Garuti, Jr. .......... | C04B 24/281 106/802 |
| 2010/0151137 A1 | 6/2010 | Kouchi et al. | |
| 2012/0252164 A1 | 10/2012 | Nakao et al. | |

FOREIGN PATENT DOCUMENTS

| | | |
|---|---|---|
| CN | 102101935 | 6/2011 |
| CN | 102738069 A | 10/2012 |
| JP | 2004-18790 | 1/2004 |
| JP | 2006-193595 | 7/2006 |
| JP | 2008-510878 | 4/2008 |
| JP | 2008106182 A * | 5/2008 |
| JP | 2008-274083 | 11/2008 |
| JP | 2011-233883 | 11/2011 |
| JP | 4848925 | 12/2011 |
| JP | 2012-171973 | 9/2012 |
| JP | 2012-171973 A | 9/2012 |
| JP | 2012-216838 A | 11/2012 |
| TW | 201239026 A1 | 10/2012 |
| WO | WO 03/040206 | 5/2003 |
| WO | WO 2008/087701 | 7/2008 |
| WO | WO 2012/111652 | 8/2012 |

OTHER PUBLICATIONS

English language machine translation of JP 2008-106182. May 8, 2008. (Year: 2008).*
Japanese Office Action dated Aug. 8, 2017 in Patent Application No. 2014-060707 (with English translation).
Japanese Office Action dated Oct. 3, 2017 in Patent Application No. 2014-069656 (with English translation).
International Search Report dated Jun. 24, 2014 in PCT/JP2014/059139 filed Mar. 28, 2014.

(Continued)

Primary Examiner — Megan McCulley
(74) Attorney, Agent, or Firm — Oblon, McClelland, Maier & Neustadt, L.L.P.

(57) ABSTRACT

To provide a composition which satisfies a high K1c value, a high glass transition temperature and a low viscosity simultaneously, and which is capable of forming an interlayer filler layer for a layered semiconductor device of which stable bonding is maintained even regardless of changes of environment.
A composition comprising an epoxy compound (A) having a viscosity at 25° C. of at most 50 Pa·s, an amine compound (B) having a melting point or softening point of at least 80° C., and an amine compound (C) having a melting point or softening point of less than 80° C., wherein the proportion of the amine compound (C) is at least 1 part by weight and less than 40 parts by weight per 100 parts by weight of the total amount of the amine compound (B) and the amine compound (C).

13 Claims, No Drawings

(56) References Cited

OTHER PUBLICATIONS

Proceedings of the Japan Institute of Electronics Packaging, Annual Meeting, pp. 61-62, 23, 2009.
Bejoy Francis, et al. "Diglycidyl Ether of Bisphenol-A Epoxy Resin Modified Using Poly(ether ether ketone) with Pendent tert-Butyl Groups", Journal of Polymer Science: Part B: Polymer Physics, vol. 45, 2481-2496 (2007).
Combined Chinese Office Action and Search Report dated Jul. 13, 2016 in Patent Application No. 201480018168.3 (with English Translation).
Combined Taiwanese Office Action and Search Report dated Jul. 6. 2017 in Patent Application No. 103111795 (with English translation).
Taiwanese Office Action dated Nov. 14, 2017 in Patent Application No. 103111795 (with English Translation).
Japanese Office Action dated Oct. 24, 2017 in Patent Application No. 2014-066824 (with English Translation).

* cited by examiner

COMPOSITION FOR INTERLAYER FILLER OF LAYERED SEMICONDUCTOR DEVICE, LAYERED SEMICONDUCTOR DEVICE, AND PROCESS FOR PRODUCING LAYERED SEMICONDUCTOR DEVICE

TECHNICAL FIELD

The present invention relates to a composition suitable for an interlayer filler layer of a layered semiconductor device, a layered semiconductor device having an interlayer filler layer containing the composition, and a process for producing a layered semiconductor device which comprises a specific step.

BACKGROUND ART

In recent years, for further improvement in the performance of semiconductor devices, research and development in layered semiconductor devices having substrates such as semiconductor substrates having a semiconductor device layer formed thereon or organic substrates piled up vertical to the surface of the plurality of substrates, is in progress in addition to refinement of transistors and wiring. As a layered semiconductor device, e.g. one having semiconductor substrates and organic substrates laminated is known, and more specifically, a three-dimensional layered semiconductor device having a structure such that semiconductor substrates are connected e.g. by electric signal terminals such as solder bumps, a space between the substrates is filled with an interlayer filler composition, and the substrates are bonded by the interlayer filler layer (for example, Patent Document 1).

Various problems of such a layered semiconductor device have been pointed out, and one of them is a problem of dissipation of heat generated from a device such as a transistor or wiring, and as one means to solve such a problem, an increase in the thermal conductivity of the interlayer filler composition may be mentioned. Specifically, the thermal conductivity of the interlayer filler composition is increased by using a highly thermally conductive epoxy resin as a thermosetting resin constituting an adhesive component of the interlayer filler composition or by using such a highly thermally conductive resin and a highly thermally conductive inorganic filler in combination. For example, an interlayer filler composition having as a filler spherical boron nitride agglomerates blended has been known (for example, Patent Document 2).

As a process for producing a layered semiconductor device having an interlayer filler composition filled in between substrates, a process by a pre-application method has been proposed in which a layer comprising an interlayer filler composition (Inter Chip Fill, hereinafter sometimes referred to as ICF) is formed, followed by heating as the case requires for B-stage formation, chips are cut out by dicing, a plurality of the obtained semiconductor substrates are laminated, temporary bonding by pressure heating is repeatedly carried out, and finally main bonding is carried out under pressure heating conditions (for example, Non-Patent Document 1).

Among such proposals of techniques such as a pre-application method for the purpose of practical use of a layered semiconductor device, a technique to improve the flowability (liquefaction) of an epoxy resin composition when a filler is densely filled in an ICF and to maintain the improved flowability (for example, Patent Document 3) and a technique to add a super engineering plastic for the purpose of improving the toughness of an epoxy resin composition have been proposed (for example, Non-Patent Document 2).

PRIOR ART DOCUMENTS

Patent Documents

Patent Document 1: WO2008/087701
Patent Document 2: JP-A-2008-510878
Patent Document 3: Japanese Patent No. 4848925
Patent Document 4: JP-A-2006-193595

Non-Patent Documents

Non-Patent Document 1: Proceedings of The Japan Institute of Electronics Packaging, Annual Meeting, 61, 23, 2009
Non-Patent Document 2: Journal of Polymer Science: Part B: Polymer Physics, Vol. 45, 2481-2496 (2007)

DISCLOSURE OF INVENTION

Technical Problem

A layered semiconductor device having a layer comprising a conventional composition formed between substrate layers has not achieved thermal conductivity sufficient for dissipation of heat accompanying an increase in the density of an integrated circuit of the layered semiconductor device. Further, problems of a layered semiconductor device are found such that various necessary properties such as proper coefficient of linear expansion and glass transition temperature should be satisfied so as to release a stress due to e.g. expansion by heat generation when the laminate is used in addition to improvement in the thermal conductivity.

Further, problems of a process for producing a layered semiconductor device having an interlayer filler composition between semiconductor substrate layers (hereinafter sometimes referred to simply as lamination process) are found such that properties required in the respective steps in the lamination process should be satisfied, such that the viscosity of the interlayer filler composition is adjusted to be a viscosity which is fitted for bonding under heating and pressurizing conditions.

Further, of the lamination process, problems which have not been known yet, such as a reduction in thickness of a layer between semiconductor substrate layers, secure bonding and the stability (reliability) of electric signal terminals between semiconductor substrates have become clear. Particularly a problem such as separation at an interface between the substrate and the interlayer filler material by a change in the environmental temperature e.g. due to a difference in the coefficient of linear expansion between the semiconductor substrate and the organic substrate in the layered semiconductor device has become clear.

The problem such as separation at an interface between the substrate and the interlayer filler material by a change in the environmental temperature influences the reliability of a semiconductor device during long-term use. If a conventional technique such as an increase in the denseness of the filler in the ICF or addition of a super engineering plastic is applied to improve the reliability, a remarkable increase in the viscosity of the ICF occurs, thus leading to poor flowability, and thus application of such a technique to the lamination process is difficult in some cases. Further, a problem has been found such that if the flowability of the composition is improved, the glass transition temperature of the ICF is decreased and the heat resistance is decreased, or the fracture toughness in plane strain (hereinafter sometimes referred to simply as K1c) is decreased, whereby e.g. separation at an interface between the substrate and the interlayer filler material is more likely to occur.

Under these circumstances, the object of the present invention is to provide a composition suitable as an interlayer filler for a layered semiconductor device, not only which is excellent in the thermal conductivity but also which is capable of secure electrical bonding of semiconductor substrates, which has a high glass transition temperature and thus excellent heat resistance, and which is capable of forming a filling interlayer having a suitable coefficient of linear expansion and a high toughness to maintain stable bonding without cracks or separation even by various changes of environment, the composition having high flowability applicable even to the lamination process. Another object is to provide a layered semiconductor device using it, and its production process.

Solution to Problem

The present inventors have conducted extensive studies to achieve the above objects and as a result, found that the above objects can be achieved by the following invention, and accomplished the present invention. That is, the present invention provides the following.

[1] A composition comprising an epoxy compound (A) having a viscosity at 25° C. of at most 50 Pa·s, an amine compound (B) having a melting point or softening point of at least 80° C., and an amine compound (C) having a melting point or softening point of less than 80° C., wherein the proportion of the amine compound (C) is at least 1 part by weight and less than 40 parts by weight per 100 parts by weight of the total amount of the amine compound (B) and the amine compound (C).

[2] The composition according to the above [1], wherein the amine compound (C) is a compound having an amino group directly bonded to a ring having aromaticity.

[3] The composition according to the above [1] or [2], wherein the amine compound (C) is a compound represented by the following formula (1):

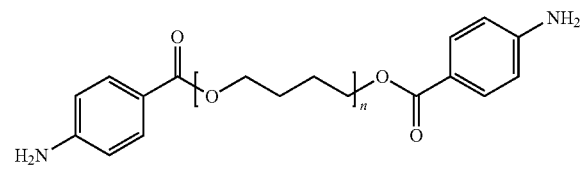

wherein n is an integer of from 1 to 10.

[4] The composition according to any one of the above [1] to [3], wherein the viscosity at 75° C. of the amine compound (C) is at most 50 Pa·s.

[5] The composition according to any one of the above [1] to [4], wherein the epoxy equivalent of the epoxy compound (A) is at least 150 g/equivalent and at most 650 g/equivalent.

[6] The composition according to any one of the above [1] to [5], which further contains at least one type of inorganic filler (D).

[7] A composition comprising an epoxy compound (A-1) having a melt viscosity at 120° C. of at least 0.001 Pa·s and at most 1 Pa·s, an inorganic filer (D-1) having a volume average particle size of at least 0.1 μm and at most 10 μm, and an inorganic filler (D-2) consisting of a chemical species different from the inorganic filler (D-1) having a volume average particle size of at least 0.1 μm and at most 10 μm and different from the volume average particle size of the inorganic filler (D-1).

[8] The composition according to the above [7], wherein the difference in the volume average particle size between the inorganic filler (D-1) and the inorganic filler (D-2) is at least 1 μm and at most 5 μm.

[9] The composition according to the above [7] or [8], wherein the inorganic filler (D-1) is a boron nitride filler.

[10] The composition according to the above [7] or [8], wherein the inorganic filler (D-1) is a silica filler.

[11] The composition according to any one of the above [7] to [10], wherein the epoxy equivalent of the epoxy compound (A-1) is at least 150 g/equivalent and at most 650 g/equivalent.

[12] The composition according to any one of the above [1] to [11], which contains a flux (E).

[13] The composition according to any one of the above [1] to [12], which contains a dispersing agent (F).

[14] A layered semiconductor device comprising a plurality of substrates and an interlayer filler layer formed between the substrates, wherein at least one interlayer filler layer is a layer obtained by curing the composition as defined in any one of the above [1] to [13].

[15] The layered semiconductor device according to the above [14], wherein at least one of the substrates is a semiconductor substrate having a semiconductor device layer formed thereon.

[16] The layered semiconductor device according to the above [15], which has a plurality of such semiconductor substrates.

[17] A process for producing a layered semiconductor device, which comprises a step of forming a layer of the composition as defined in any one of the above [1] to [13] on the surface of a semiconductor substrate having a semiconductor device layer formed thereon by a pre-application method, laminating the semiconductor substrate and another substrate and pressure-bonding them, and treating the laminate at from 120° C. to 180° C.

[18] The process for producing a layered semiconductor device according to the above [17], wherein said another substrate is a semiconductor base having a semiconductor device layer formed thereon.

Advantageous Effects of Invention

According to the present invention, it is possible to provide a composition suitable for an interlayer filler for a layered semiconductor device, not only which is excellent in the thermal conductivity but also which is capable of secure electrical bonding of semiconductor substrates, which has a high glass transition temperature and thus excellent heat resistance, and which is capable of forming a filling interlayer having a suitable coefficient of linear expansion and a high toughness to maintain suitable bonding without cracks or separation even by various changes of environment and to improve the long-term reliability of a semiconductor device, the composition having high flowability applicable even to the lamination process. Further, it is possible to provide a layered semiconductor device using it and its production process.

DESCRIPTION OF EMBODIMENTS

Now, embodiments of the present invention will be described. However, the present invention is not limited to the following embodiments, and various modifications are possible within a range of the scope of the invention.

A first aspect of the present invention is characterized in use of a specific epoxy compound and at least two types of amine compounds each having a specific melting point in combination, and a second aspect of the present invention is characterized in use of a specific epoxy compound and at least two types of fillers each having a specific volume average particle size in combination. These aspects relate to a composition which contributes to achievement of objects to solve problems of the interlayer filler layer to be formed between substrates of a layered semiconductor device, which are problems to be solved by the present invention. In the present invention, the first aspect and the second aspect may properly be combined, and usually the first aspect and the second aspect are preferably combined.

More specifically, the first aspect of the present invention resides in a composition comprising an epoxy compound (A) having a viscosity at 25° C. of at most 50 Pa·s, an amine compound (B) having a melting point or softening point of at least 80° C., and an amine compound (C) having a melting point or softening point of less than 80° C., wherein the proportion of the amine compound (C) is at least 1 part by weight and less than 40 parts by weight per 100 parts by weight of the total amount of the amine compound (B) and the amine compound (C).

Further, more specifically, the second aspect of the present invention resides in a composition comprising an epoxy compound (A-1) having a melt viscosity at 120° C. of from 0.001 Pa·s to 1 Pa·s, an inorganic filler (D-1) having a volume average particle size of at least 0.1 μm and at most 10 μm, and an inorganic filler (D-2) consisting of a chemical species different from the inorganic filler (D-1) having a volume average particle size of at least 0.1 μm and at most 10 μm and different from the volume average particle size of the inorganic filler (D-1).

<Epoxy Compound>

The epoxy compound is a compound having at least one epoxy group, and in the present invention, an epoxy compound having any structure may be used within a range specified by the present invention. The epoxy compound in the present invention is preferably a compound having at least two epoxy groups, whereby the glass transition temperature of the composition of the present invention is improved. Further, in order that the K1c value of a cured product obtained by thermally curing the composition of the present invention is high, the number of epoxy groups contained in one molecule is preferably at least 1 and at most 8, more preferably at least 2 and at most 3.

Further, in order to improve the thermal conductivity of the composition of the present invention, the epoxy compound of the present invention may, for example, be a bisphenol A type epoxy compound, a bisphenol F type epoxy compound, a bisphenol S type epoxy compound, a biphenyl type epoxy compound, a naphthalene ring-containing epoxy compound, an epoxy compound having a dicyclopentadiene skeleton, a phenol novolac type compound, a cresol novolac type epoxy compound, a phenol alalkyl type epoxy resin, a dicyclopentadiene type epoxy resin, a glycidyl ester type epoxy resin, a glycidylamine type epoxy resin, a polyfunctional phenol type epoxy resin, a triphenylmethane type epoxy compound, an aliphatic epoxy compound, or a copolymer epoxy resin of an aliphatic epoxy compound and an aromatic epoxy compound.

Among them, preferred is an epoxy compound having an aromatic ring such as a bisphenol A type epoxy compound, a bisphenol F type epoxy compound, a bisphenol S type epoxy compound, a biphenyl type epoxy compound or a naphthalene ring-containing epoxy compound, and more preferred is a bisphenol A type epoxy compound, a bisphenol F type epoxy compound, a naphthalene ring-containing epoxy compound or a biphenyl type epoxy compound. They may be used alone or as a mixture of at least two.

More specifically, commercially available bisphenol A type epoxy resin (YL6810, viscosity at 120° C.: at most 0.008 Pa·s) manufactured by Mitsubishi Chemical Corporation, bisphenol F type epoxy resin (1750, viscosity at 120° C.: at most 0.01 Pa·s) manufactured by Mitsubishi Chemical Corporation, biphenol type epoxy resin (YX4000(H), viscosity at 120° C.: at most 0.03 Pa·s; YL6121H, viscosity at 120° C.: at most 0.02 Pa·s) manufactured by Mitsubishi Chemical Corporation, anthracene type epoxy resin (YX8800) manufactured by Mitsubishi Chemical Corporation, bisphenol type epoxy resin (YSLV-80XY, YSLV-120TE) manufactured by New Nippon Steel Chemical Co., Ltd., hydroquinone type epoxy resin (YDC-1213) manufactured by New Nippon Steel Chemical Co., Ltd., and naphthalene type epoxy resin (HP4032D) manufactured by DIC Corporation may, for example, be mentioned.

Epoxy Compound (A)

The epoxy compound (A) having a viscosity at 25° C. of at most 50 Pa·s in the present invention is not particularly limited, and any epoxy compound may be used so long as it has a viscosity at 25° C. of at most 50 Pa·s.

The viscosity at 25° C. in the present invention is a value measured in accordance with JIS Z 8803:2011 and is a value measured by methods for viscosity measurement by a cone-flat plate type rotational viscometer. More specifically, it is measured by a type E viscometer defined by JIS K7117-2: 1999. Further, even a low molecular epoxy compound showing crystallinity is regarded as an epoxy compound having a viscosity at 25° C. of at most 50 Pa·s, if it is in a liquid state when heated to the crystal melting temperature or higher and then cooled to 25° C. within 12 hours in an environment of 5° C. or above, and has a viscosity at 25° C. of at most 50 Pa·s.

Epoxy Compound (A-1)

The epoxy compound (A-1) in the present invention is not particularly limited, and any epoxy compound may be used so long as it has a viscosity at 120° C. of from 0.001 to 1 Pa·s. The viscosity at 120° C. in the present invention may be measured by a commercially available melt viscometer. More specifically, the viscosity may be a parallel plate dynamic viscosity measured by using viscoelasticity measuring apparatus Physica MCR301 manufactured by Anton Paar Japan K.K.

The parallel plate dynamic viscosity may be measured by the following method. The resin is used as it is when it is liquid at room temperature, or when the resin is solid at room temperature, it is heated and then cooled to room temperature to obtain an irregular solid, and the resin is placed between a parallel plate dish and a parallel plate (25 mm in diameter) and the parallel plate dynamic viscosity is measured. As the measurement conditions, 0.5% of sine wave distortion is applied to the sample, the angle frequency of the distortion is 10 rad/sec, and the viscosity in a step of raising the temperature at a rate of 3° C. per minute is measured at from 40° C. to 200° C.

<Control of Viscosity of Epoxy Compound>

In order that the epoxy compound in the present invention has a viscosity at 25° C. of at most 50 Pa·s or the epoxy compound has a viscosity at 120° C. of from 0.001 to 1 Pa·s, a conventional method of adjusting the viscosity of a compound may be employed, and for example, it is possible to lower the viscosity by adjusting the molecular weight of the compound or by introducing a structure having high flexibility such as an aliphatic hydrocarbon group into the skeleton of the compound, and it is possible to increase the viscosity by introducing a structure having low flexibility such as a cyclic structure or a structure having a bridge head. Further, the desired viscosity may be achieved e.g. by mixing a compound having a high viscosity and a compound having a low viscosity or by using a compound having a definite melting point to lower the viscosity. A resin having a definite melting point is a substance which is present as a stable solid in a crystal state at room temperature and further which is no longer in the crystalline state as soon as it reaches its melting point and becomes a liquid having a very low viscosity, and is a resin of which the change in the crystalline state can be confirmed e.g. by a commercially available differential scanning calorimeter.

More preferably, a method of controlling the epoxy equivalent of the epoxy compound may be mentioned, and a compound having a low epoxy equivalent may be used to lower the viscosity and a compound having a high epoxy equivalent may be used to increase the viscosity. The epoxy equivalent may be measured by a conventional method.

More specifically, in order that the viscosity at 25° C. is at most 50 Pa·s, an epoxy compound having an epoxy equivalent of preferably at most 500 g/equivalent, more preferably at most 300 g/equivalent, further preferably at most 210 g/equivalent, particularly preferably at most 190 g/equivalent is used.

Further, in order that the viscosity at 120° C. is at least 0.001 and at most 1 Pa·s, the epoxy equivalent is preferably at least 150 g/equivalent and at most 650 g/equivalent, more preferably at least 175 g/equivalent and at most 600 g/equivalent. An epoxy compound having an epoxy equivalent lower than 150 g/equivalent tends to be inferior in the heat resistance. If an epoxy compound has an epoxy equivalent higher than 650 g/equivalent, the melting point of the epoxy compound tends to be high and in addition, the melt viscosity of the composition of the present invention tends to be high, and thus a problem in bonding of semiconductor device chips may arise, whereby the obtainable layered semiconductor device may not effectively function in some cases, or physical properties required in the respective steps in the 3D lamination process may not be satisfied, and production of a layered semiconductor device may be difficult in some cases.

<Other Epoxy Compound>

Further, the composition of the present invention may contain an epoxy compound (A-2) other than the epoxy compound of the present invention (hereinafter sometimes referred to simply as epoxy compound (A-2)) within a range not to impair the object of the present invention.

The epoxy compound (A-2) may be any epoxy compound so long as its viscosity at 25° C. and its viscosity at 120° C. are out of ranges of those of the epoxy compounds of the present invention. For example, a bisphenol A type epoxy resin, a bisphenol F type epoxy resin, a naphthalene type epoxy resin, a phenol novolac type epoxy resin, a cresol novolac type epoxy resin, a phenol alalkyl type epoxy resin, a biphenyl type epoxy resin, a triphenylmethane type epoxy resin, a dicyclopentadiene type epoxy resin, a glycidyl ester type epoxy resin, a glycidylamine type epoxy resin, a polyfunctional phenol type epoxy resin, a bisphenol A type or bisphenol F type solid epoxy resin or a phenoxy resin may be used. Such resins may be used alone or as a mixture of at least two.

With a view to controlling the viscosity of the composition of the present invention, the epoxy equivalent of the epoxy compound (A-2) is preferably higher than 650 g/equivalent and lower than 30,000 g/equivalent, more preferably at least 800 g/equivalent and at most 25,000 g/equivalent. An epoxy compound having an epoxy equivalent of at most 650 g/equivalent tends to be insufficient in many cases to achieve sufficient physical properties of the composition to be used for an interlayer filler even when such an epoxy compound is used in combination, and if it has an epoxy equivalent higher than 30,000 g/equivalent, the viscosity of the composition of the present invention may be so high as not to be fitted to the lamination process.

In a case where the composition of the present invention contains the epoxy compound (A-2), the proportion of the epoxy compounds defined by the present invention (the epoxy compound (A) and the epoxy compound (A-1)) to the epoxy compound (A-2) is such that the total weight (the sum of the weight of the epoxy compound (A) and the weight of the epoxy compound (A-1)) of the epoxy compounds defined by the present invention is from 75 to 99 wt %, preferably from 80 to 95 wt % per 100 wt % of the total of all the epoxy compounds.

<Curing Agent>

The composition of the present invention may contain a curing agent. The curing agent in the present invention means a substance which contributes to the crosslinking reaction between epoxy groups of the epoxy compound, and according to the first aspect of the present invention, the amine compound (B) and the amine compound (C) as essential components correspond to the curing agent.

The curing agent is not particularly limited and any curing agent known as a common curing agent for an epoxy compound may be used. It may, for example, be a phenol type curing agent, an amine type curing agent such as an aliphatic amine, a polyether amine, an alicyclic amine or an aromatic amine, an acid anhydride type curing agent, an amide type curing agent, a tertiary amine, imidazole or a derivative thereof, an organic phosphine, a phosphonium salt, a tetraphenylborate salt, an organic acid dihydrazide, a boron halide amine complex, a polymercaptan type curing agent, an isocyanate type curing agent or a blocked isocyanate type curing agent. Such curing agents may be used alone or as a mixture of at least two in an optional combination and proportion.

The phenol type curing agent may, for example, be specifically bisphenol A, bisphenol F, 4,4'-dihydroxy diphenyl methane, 4,4'-dihydroxy diphenyl ether, 1,4-bis(4-hydroxyphenoxy)benzene, 1,3-bis(4-hydroxyphenoxy)benzene, 4,4'-dihydroxy diphenyl sulfide, 4,4'-dihydroxy diphenyl ketone, 4,4'-dihydroxy diphenyl sulfone, 4,4'-dihydroxybiphenyl, 2,2'-dihydroxybiphenyl, 10-(2,5-dihydroxyphenyl)-10H-9-oxa-10-phosphaphenanthrene-10-oxide, phenol novolak, bisphenol A novolak, o-cresol novolak, m-cresol novolak, p-cresol novolak, xylenol novolak, poly-p-hydroxystyrene, hydroquinone, resorcin, catechol, t-butyl-catechol, t-butylhydroquinone, phloroglucinol, pyrogallol, t-butylpyrogallol, 1,2,4-benzenetriol, 2,3,4-trihydroxybenzophenone, 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 1,8-dihydroxynaphthalene, 2,3-dihydroxynaphthalene, 2,4-dihydroxynaphthalene, 2,5-dihydroxynaphthalene, 2,6-dihydroxynaphthalene, 2,7-dihydroxynaphthalene, 2,8-dihydroxynaphthalene, an allylated product or polyallylated product of the above dihydroxynaphthalene, allylated bisphenol A, allylated bisphenol F, allylated phenol novolak, allylated pyrogallol or polyallylated pyrogallol.

As specific examples of the amine type curing agent, the aliphatic amine may, for example, be ethylenediamine, 1,3-diaminopropane, 1,4-diaminopropane, hexamethylenediamine, 2,5-dimethylhexamethylenediamine, trimethylhexamethylenediamine, diethylenetriamine, iminobispropylamine, bis(hexamethylene)triamine, triethylenetetramine, tetraethylenepentamine, pentaethylenehexamine, N-hydroxyethylethylenediamine or tetra(hydroxyethyl)ethylenediamine. The polyether amine may, for example, be triethylene glycol diamine, tetraethylene glycol diamine, diethylene glycol bis(propylamine), polyoxypropylene diamine or polyoxypropyrene triamine. The alicyclic amine may, for example, be isophorone diamine, menthenediamine, N-aminoethylpiperazine, bis(4-amino-3-methyldicyclohexyl)methane, bis(aminomethyl)cyclohexane, 3,9-bis(3-aminopropyl)-2,4,8,10-tetraoxaspiro(5,5)undecane or norbornenediamine. The aromatic amine may, for example, be tetrachloro-p-xylene diamine, m-xylene diamine, p-xylene diamine, m-phenylenediamine, o-phenylenediamine, p-phenylenediamine, 2,4-diaminoanisole, 2,4-toluenediamine, 2,4-diaminodiphenylmethane, 4,4'-diaminodiphenylmethane, 4,4'-diamino-1,2-diphenylethane, 2,4-diaminodiphenylsulfone, 4,4'-diaminodiphenylsulfone, m-aminophenol, m-aminobenzylamine, benzyldimethylamine, 2-dimethylaminomethyl)phenol, triethanolamine, methylbenzylamine, α-(m-aminophenyl)ethylamine, α-(p-aminophenyl)ethylamine, diaminodiethyldimethyldiphenylmethane or α,α'-bis(4-aminophenyl)-p-diisopropylbenzene.

The acid anhydride type curing agent may, for example, be specifically dodecenyl succinic anhydride, polyadipic anhydride, polyazelaic anhydride, polysebacic anhydride, poly(ethyloctadecanedioic) anhydride, poly(phenylhexadecanedioic) anhydride, methyltetrahydrophthalic anhydride, methylhexahydrophthalic anhydride, hexahydrophthalic anhydride, methylhimic anhydride, tetrahydrophthalic anhydride, trialkyltetrahydrophthalic anhydride, methylcyclohexene dicarboxylic anhydride, methylcyclohexenetetracarboxylic anhydride, phthalic anhydride, trimellitic anhydride, pyromellitic anhydride, benzophenonetetracarboxylic anhydride, ethylene glycol bistrimellitate dianhydride, HET anhydride, Nadic anhydride, methyl Nadic anhydride, 5-(2, 5-dioxotetrahydro-3-furanyl)-3-methyl-3-cyclohexane-1,2-dicarboxylic anhydride, 3,4-dicarboxy-1,2,3,4-tetrahydro-1-naphthalene succinic dianhydride, or 1-methyl-dicarboxy-1, 2,3,4-tetrahydro-1-naphthalene succinic dianhydride.

The amide type curing agent may, for example, be dicyandiamide or a polyamide resin.

The tertiary amine may, for example, be 1,8-diazabicyclo (5,4,0)undecene-7, triethylenediamine, benzyldimethylamine, triethanolamine, dimethylaminoethanol or tris(dimethylaminomethyl)phenol.

The imidazole or its derivative may, for example, be 1-cyanoethyl-2-phenylimidazole, 2-phenylimidazole, 2-ethyl-4(5)-methylimidazole, 2-phenyl-4-methylimidazole, 1-benzyl-2-methylimidazole, 1-benzyl-2-phenylimidazole, 1-cyanoethyl-2-undecylimidazole, 1-cyano-2-phenylimidazole, 1-cyanoethyl-2-undecylimidazole trimellitate, 1-cyanoethyl-2-phenylimidazolium trimellitate, 2,4-diamino-6-[2'-methylimidazolyl-(1')]-ethyl-s-triazine, 2,4-diamino-6-[2'-ethyl-4'-methylimidazolyl-(1')]-ethyl-s-triazine, 2,4-diamino-6-[2'-methylimidazolyl-(1')]-ethyl-s-triazine isocyanuric acid adduct, 2-phenylimidazole isocyanuric acid adduct, 2-phenyl-4,5-dihydroxymethylimidazole, 2-phenyl-4-methyl-5-hydroxymethylimidazole, an adduct of an epoxy resin with the above imidazole, 2-phenyl-4,5-dihydroxymethylimidazole or 2-phenyl-4-methyl-5-hydroxymethylimidazole.

The organic phosphine may, for example, be tributylphosphine, methyldiphenylphosphine, triphenylphosphine, diphenylphosphine or phenylphosphine. The phosphonium salt may, for example, be tetraphenylphosphonium tetraphenylborate, tetraphenylphosphonium ethyltriphenylborate or tetrabutylphosphonium tetrabutylborate, and the tetraphenylborate salt may, for example, be 2-ethyl-4-methylimidazole tetraphenylborate or N-methylmorpholine tetraphenylborate.

Further, an aromatic amine type curing agent represented by the following formula (1) may be mentioned.

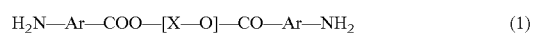

$$H_2N-Ar-COO-[X-O]-CO-Ar-NH_2 \quad (1)$$

In the above formula (1), Ar represents an arylene group, and is more preferably a phenylene group.

In the formula (1), —[X—O]— represents at least one structure selected from —[(CH$_2$)$_n$—O]$_m$— and its branched structure in which any carbon has an alkyl group. n in the formula (1) may be an integer of from 1 to 20, and is preferably an integer of from 2 to 12, more preferably from 2 to 8, most preferably from 2 to 4. Further, m in the formula (1) may be an integer of from 1 to 10, preferably an integer of from 1 to 6, most preferably an integer of from 1 to 4. If n or m is too large, the coefficient of elasticity or the glass transition temperature of the obtainable cured product tends to decrease, whereas if n=0, due to the stiffness of the aromatic diamine, mobility of mesogen in the epoxy compound may be decreased, formation of a domain phase comprising lines of mesogens in a highly ordered state may be inhibited, and the thermal conductivity may not be high in some cases.

More specifically, bis(4-aminobenzoyloxy)methane, bis(4-aminobenzoyloxy)ethane, 1,3-bis(4-aminobenzoyloxy)propane, 1,4-bis(4-aminobenzoyloxy)butane, 1,5-bis(4-aminobenzoyloxy)pentane, 1,6-bis(4-aminobenzolyoxy)hexane, 1,7-bis(4-aminobenzoyloxy)heptane, 1,8-bis(4-aminobenzoyloxy)octane, 1,9-bis(4-aminobenzoyloxy)nonane, 1,10-bis(4-aminobenzoyloxy)decane, 1,11-bis(4-aminobenzoyloxy)undecane or 1,12-bis(4-aminobenzoyloxy)dodecane may, for example, be mentioned.

Further, among them, preferred is at least one structure selected from a structure such that —[X—O]— is a unit derived from butylene glycol (n is 4) and a branched structure in which X has an alkyl group, in view of industrial availability. Such an aromatic amine type curing agent may, for example, be 1,4-bis(4-aminobenzoyloxy)butane, di(tetramethyleneoxy)bis-4-aminobenzoate, tri(tetramethyleneoxy)bis-4-aminobenzoate or poly(tetramethyleneoxy)bis-4-aminobenzoate.

The content of the curing agent in the composition of the present invention is preferably at least 0.005 part by weight and at most 200 parts by weight, more preferably at least 0.01 part by weight and at most 180 parts by weight per 100 parts by weight of all the epoxy compounds.

If the content of the curing agent is less than 0.005 part by weight per 100 parts by weight of all the epoxy compounds, curing may be insufficient, and if it exceeds 200 parts by weight, the adhesion, or desired physical properties of a layered semiconductor device such as thermal conductivity, may not be obtained in some cases.

<Amine Compound (B) Having Melting Point or Softening Point of at Least 80° C.>

The amine compound (B) having a melting point or softening point of at least 80° C. which is an essential component according to the first aspect of the present invention may be any amine compound so long as it has a melting point or softening point of at least 80° C. In the present invention, the melting point is defined by the temperature of the endothermic peak top which appears when the compound is heated from 25° C. to 100° C. at a rate of 2° C./min by using a differential scanning calorimeter.

Further, the softening point is defined by the temperature at which a needle deeply sinks when measurement is conducted under conditions of a load of 2 gf and a temperature-increasing rate of 5° C./min, using a thermal mechanical analyzer.

The amine compound is a compound having at least one amino group, and as the amine compound (B) in the present invention, it is preferred to use a compound having at least two amino groups with a view to increasing the glass transition temperature of the composition of the present invention. Further, with a view to increasing the K1c value of the composition of the present invention, the number of amino groups is preferably at least 1 and at most 5, more preferably at least 1 and at most 3, particularly preferably at least 1 and at most 2.

In order to improve the heat resistance of the composition of the present invention, the amine compound (B) of the present invention preferably has a cyclic structure in its molecular structure. The cyclic structure may be any of a cyclic structure of an aliphatic hydrocarbon, a hetero atom-containing cyclic structure which contains a nitrogen atom, an oxygen atom or the like, and a cyclic structure having aromaticity. More specifically, preferred is an amine compound having a benzenoid aromatic ring such as benzene, naphthalene or anthracene.

In order that the amine compound (B) of the present invention has a melting point or softening point of at least 80° C., usually, a method of increasing the molecular weight, a method of using a compound having a stiff structure with a plurality of aromatic rings, or a method of increasing the number of amino groups in one molecule may, for example, be mentioned, and an amine compound having a melting point or softening point of at least 80° C. may be selected by properly combining such methods.

The amine compound (B) may, for example, be specifically an aromatic amine such as o-phenylenediamine, p-phenylenediamine, 4,4'-diaminodiphenylmethane, 4,4'-diamino-1,2-diphenylethane, 2,4-diaminodiphenyl sulfone, 4,4'-diaminodiphenyl sulfone, m-aminophenol, 2-(dimethylaminomethyl)phenol, methylbenzylamine, α-(m-aminophenyl)ethylamine, α-(p-aminophenyl)ethylamine, α,α'-bis(4-aminophenyl)-p-diisopropylbenzene or trimethylenebis-4-aminobenzoate. Among them, use of 4,4-diaminodiphenyl sulfone is preferred. By using 4,4'-diaminodiphenyl sulfone as the amine compound (B), an interlayer filler composition having a high K1c value and a high glass transition point will be obtained.

<Amine Compound (C) Having Melting Point or Softening Point of Less than 80° C.>

The amine compound (C) having a melting point or softening point of less than 80° C. which is an essential component according to the first aspect of the present invention may be any amine compound so long as it has a melting point or softening point of less than 80° C. The definitions of the melting point and the softening point of the amine compound (C) are the same as those of the amine compound (B).

As the amine compound (C) of the present invention, with a view to increasing the glass transition temperature of the composition of the present invention, it is preferred to use a compound having at least two amino groups. Further, with a view to increasing the K1c value of a cured product of the composition of the present invention, the number of amino groups is preferably at least 1 and at most 3, more preferably at least 1 and at most 2.

Further, with a view to improving the heat resistance of the composition of the present invention, the amine compound (C) of the present invention is preferably an amine compound having at least one cyclic structure with aromaticity in its molecule, more preferably at least two cyclic structures with aromaticity. The cyclic structure with aromaticity may, for example, be a benzenoid aromatic ring, a non-benzenoid aromatic ring or a heterocyclic aromatic ring, preferably a benzenoid aromatic ring or a heterocyclic aromatic ring. The number of cycles in the cyclic structure with aromaticity is preferably at most 3, more preferably at most 2, particularly preferably 1. The benzenoid aromatic ring may, for example, be benzene, naphthalene, anthracene, pyrene or perylene, preferably benzene or naphthalene, more preferably benzene. Further, the non-benzenoid aromatic ring may, for example, be azulene or ferrocene. Further, the heterocyclic aromatic ring may, for example, be pyridine, thiophene, pyrrol, quinoline or indole, preferably pyridine or quinoline.

Further, the amino group of the amine compound (C) of the present invention is preferably directly bonded to the cyclic structure with aromaticity with a view to improving the glass transition temperature of the composition of the present invention, and in the case of a compound having at least two amino groups, the respective amino groups are more preferably directly bonded to separate cyclic structures with aromaticity. In a case where the respective amino groups are directly bonded to separate cyclic structures with aromaticity, the linking portion of the respective cyclic structures with aromaticity is not limited, and they may be linked with a bivalent group or may be directly linked. The bivalent group used in the linking portion may, for example, be more specifically an alkylene group or an oxyalkylene group, and in view of easy production of the amine compound (C), the bivalent group is preferably bonded to the cyclic structures with aromaticity via a carbonyl group or an ester group.

In order to improve the flowability of the composition of the present invention, as the amine compound (C), a compound having a molecular weight of preferably at most 1,000 g/mol, more preferably at most 800 g/mol, further preferably at most 600 g/mol, particularly preferably at most 500 g/mol is used.

In order that the amine compound (C) of the present invention has a melting point or softening point of less than 80° C., usually, a method of reducing the molecular weight, a method of using a compound having a structure containing not only an aromatic ring but also an aliphatic chain, or a method of increasing the number of substituents may, for example, be mentioned, and an amine compound having a melting point or softening point of less than 80° C. may be selected by properly combining such methods.

The amine compound (C) may, for example, be specifically an aliphatic amine such as ethylenediamine, 1,3-diaminopropane, 1,4-diaminopropane, hexamethylenediamine, 2,5-dimethylhexamethylenediamine, trimethylhexamethylenediamine, diethylenetriamine, iminobispropylamine, bis(hexamethylene)triamine, triethylenetetramine, tetraethylenepentamine, pentaethylenehexamine, N-hydroxyethylethylenediamine, tetra(hydroxyethyl)ethylenediamine or triethanolamine. Further, a polyether amine having a melting point or softening point of less than 80° C., such as an ether amine such as triethylene glycol diamine, tetraethylene glycol diamine or diethylene glycol bis(propylamine), a polyoxypropylenediamine or a polyoxypropylenetriamine may, for example, be mentioned. Further, an alicyclic amine such as isophorone diamine, menthenediamine, N-aminoethylpiperazine, bis(4-amino-3-methyldicyclohexyl)methane, bis(aminomethyl)cyclohexane, 3,9-bis(3-aminopropyl)-2,4,8,10-tetraoxaspiro(5,5)undecane or norbornenediamine may, for example, be mentioned. Further, an aromatic amine such as tetrachloro-p-xylenediamine, m-xylenediamine, p-xylenediamine, m-phenylenediamine, 2,4-diaminoanisole, 2,4-toluenediamine, 2,4-diaminodiphenylmethane, m-aminobenzylamine, benzyldimethylamine, diaminodiethyldimethyldiphenylmethane or polytetramethyleneoxybis-4-aminobenzoate may, for example, be mentioned.

As the amine compound (C), more specifically, a compound represented by the following formula (1) is preferably used. In the following formula (1), n is an integer of from 1 to 10, and with a view to accelerating the progress of curing of the composition, it is preferably an integer of from 1 to 6, more preferably an integer of from 1 to 4. Further, in the following formula (1), the number of the substituent of the amino group to the aromatic ring may be one or more, and preferred is a compound in which the substituent is on the ortho-position, more preferably on the para-position, to the ketone group.

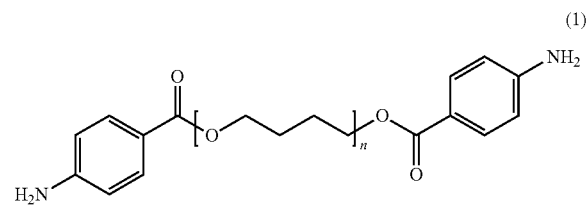

(1)

<Inorganic Filler (D)>

The composition of the present invention may contain an inorganic filler (D) within a range not to impair the effects of the present invention. According to the second aspect of the present invention, the inorganic filler (D) is an essential component, and the composition contains as the inorganic filler (D) an inorganic filler (D-1) having a specific volume average particle size and an inorganic filler (D-2) which is chemically different from the inorganic filler (D-1). Here, a chemically different inorganic filler is defined to be not only an inorganic filler constituted by different types of elements but also an inorganic filler constituted by the same types of elements differing in the compositional ratio.

Particularly when an inorganic filler (D) having a high coefficient of thermal conductivity is contained, thermal conduction from the semiconductor substrate is accelerated, the temperature of the semiconductor substrate is decreased, and a layered semiconductor device may be stably operated. Further, by the composition of the present invention containing the inorganic filler (D), the coefficient of linear expansion of an interlayer filler layer obtainable from the composition of the present invention can be controlled to be within a preferred range, and further, the K1c value can be improved.

Such an inorganic filler (D) may, for example, be more specifically particles of at least one member selected from the group consisting of a metal, carbon, a metal carbide, a metal oxide and a metal nitride. The carbon may, for example, be carbon black, carbon fibers, graphite, fullerene or diamond. The metal carbide may, for example, be silicon carbide, titanium carbide or tungsten carbide. The metal oxide may, for example, be magnesium oxide, aluminum oxide, silicon oxide, calcium oxide, zinc oxide, yttrium oxide, zirconium oxide, cerium oxide, ytterbium oxide, or SiAlON (ceramic comprising silicon, aluminum, oxygen and nitrogen). Further, the shape is not particularly limited, and a shape of particles, whiskers, fibers, plates or agglomerates thereof may be mentioned. The metal nitride may, for example, be boron nitride, aluminum nitride or silicon nitride.

The interlayer filler for a layered semiconductor device is required to have insulating properties in many cases, and thus the inorganic filler (D) is preferably an oxide or a nitride. Such an inorganic filler (D) may, for example, be more specifically alumina ($Al_2O_3$), aluminum nitride (AlN), boron nitride (BN), silicon nitride ($Si_3N_4$) or silica ($SiO_2$).

The inorganic fillers (D) may be used alone or as a mixture of at least two in an optional combination and proportion.

Coefficient of Thermal Conductivity

The coefficient of thermal conductivity of the inorganic filler (D) may be measured by steady-state method or transient method using a thin plate obtained by e.g. sintering. In the transient method, since the coefficient of thermal conductivity $\lambda$ is proportional to the thermal diffusivity ($\alpha$), the specific heat capacity (Cp) and the density ($\rho$), $\alpha$, Cp and $\rho$ are respectively obtained for example in accordance with the method defined by JIS R1611, and the coefficient of thermal conductivity $\lambda$ is determined from their product.

Volume Average Particle Size

If the particle size of the inorganic filler (D) is too large, drawbacks may occur such that electrical bonding between layers in the layered semiconductor device is impaired, or the electrical bonding of the substrates once bonded is broken e.g. by a temperature change. Further, if the particle size is too small, the particles are likely to agglomerate and the diffusivity in the composition tends to be poor, thus leading to a viscosity increase or bonding failure. Thus, in the case of an inorganic filler in the form of particles in a flat shape, it is preferred to use one having a volume average particle size of at least 0.1 µm and at most 10 µm, more preferably at least 1 µm and at most 9 µm, further preferably at least 2 µm and at most 8 µm, most preferably at least 3 µm and at most 5 µm.

The volume average particle size of the inorganic filler (D) may be obtained from the particle size distribution measured by using a conventional particle size distribution measuring apparatus, by dispersing the inorganic filler (D) in a proper solvent and measuring the particle size distribution e.g. by a laser diffraction/scattering type particle size distribution measuring apparatus. More specifically, the volume average particle size may be measured by the following method. The interlayer filler composition is dispersed in cyclohexanone at a desired concentration, and the volume particle size distribution is measured by a particle size distribution measuring apparatus ("SALD-2200" manufactured by Shimadzu Corporation). From the obtained particle size distribution, the volume average particle size of the inorganic filler after grinding is obtained.

In recent years, for further improvement in the performance such as speeding up and an increase in the capacity, the distance between substrates of a layered semiconductor device tends to be short, and the maximum particle size of the inorganic filler in the interlayer filler layer between the substrates is preferably at most ⅓ of the distance between the substrates, in view of the electrical bonding.

Whereas, if the particle size of the inorganic filler (D) is too small, the number of necessary thermally conductive passes tends to increase, whereby the probability of the thermally conductive passes being connected from top to bottom in the thickness direction between the chips tends to be low, and the coefficient of thermal conductivity in the thickness direction of the interlayer filler layer may be insufficient even if combined with the epoxy compound having high thermal conductivity. Further, if the particle size of the inorganic filler (D) is too small, the inorganic filler (D) is likely to agglomerate, thus deteriorating the dispersibility of the inorganic filler (D) in the composition. In the present invention, by the volume average particle size of the inorganic filler (D) being within the above range, excessive aggregation of the filler particles can be suppressed, and a filling interlayer having a sufficient coefficient of thermal conductivity can be obtained.

Further, the inorganic filler (D) may be properly subjected to surface treatment to increase the dispersibility in the composition. More specifically, it may be properly subjected to surface treatment e.g. by a silane coupling agent. The silane coupling agent is preferably one having as a functional group at least one group selected from a vinyl group, an epoxy group, an amino group, a ureido group, a mercapto group, a sulfide group and an isocyanate group, more preferably one having an epoxy group or an amino group.

The inorganic filler (D) immediately after prepared may not satisfy the above particle size range since the powder agglomerates. Accordingly, the inorganic filler is preferably ground so that the above particle size range is satisfied.

The method of grinding the inorganic filler is not particularly limited, and a known grinding method such as a shredding method by a roll mill or a planetary mixer, a method of stirring and mixing it with grinding media such as zirconia beads, or jet spraying may be applied.

Specific Surface Area

The specific surface area of the inorganic filler (D) is, with a view to lowering the viscosity of the composition, preferably at least 0.1 m$^2$/g and at most 100 m$^2$/g, more preferably at least 0.5 m$^2$/g and at most 50 m$^2$/g, particularly preferably at least 1 m$^2$/g and at most 10 m$^2$/g. The specific surface area may be measured by a conventional specific surface area measuring method such as a gas adsorption method, and may be measured, for example, by the following method. The inorganic filler (D) is pre-treated in a nitrogen gas flow at 250° C. for 15 minutes, and then the specific surface area is measured by BET one point method (adsorption gas: nitrogen) using Macsorb HM MODEL-1201 manufactured by Mountech Co., Ltd.

Content of Inorganic Filler

The content of the inorganic filler (D) in the composition of the present invention is preferably at least 10 parts by weight and at most 400 parts by weight, more preferably at least 20 parts by weight and at most 300 parts by weight, particularly preferably at least 20 parts by weight and at most 240 parts by weight per 100 parts by weight of the total amount of all the epoxy compounds and all the curing agents. If the content of the inorganic filler (D) is less than 10 parts by weight per 100 parts by weight of the total amount of all the epoxy compounds and all the curing agents, the effect by the inorganic filler (D) tends to be small, and the desired K1c value may not be obtained, and if it exceeds 400 parts by weight, the electrical bonding between substrates may be impaired.

<Inorganic Filler (D-1)>

According to the second aspect of the present invention, the composition contains an inorganic filler (D-1) having a volume average particle size of at least 0.1 μm and at most 10 μm. As the inorganic filler (D-1), a mixture of several types of particles differing in the shape of the particles or in the crystal structure may be used so long as they are chemically the same, and in such a case, the volume average particle size is defined as the volume average particle size comprehensively measured with respect to the entire particles which are chemically the same.

The volume average particle size of the inorganic filler (D-1) may be obtained in the same manner as the inorganic filler (D) from the particle size distribution measured by using a conventional particle size distribution measuring apparatus by dispersing the inorganic filler (D-1) in a proper solvent and measuring the particle size distribution e.g. by a laser diffraction/scattering type particle size distribution measuring apparatus. Specifically, for example, the interlayer filler composition is dispersed in cyclohexanone at a desired concentration, and the volume particle size distribution is measured by a particle size distribution measuring apparatus ("SALD-2200" manufactured by Shimadzu Corporation). From the obtained particle size distribution, the average particle size of the inorganic filler after grinding is obtained.

As the inorganic filler (D-1), the same filler as the inorganic filler (D) may be used so long as the volume average particle size is at least 0.1 μm and at most 10 μm, and preferred examples are also the same as those of the inorganic filler (D), and particularly preferred is a boron nitride filler or a silica filler. According to the second aspect of the present invention, the inorganic filler (D-1) and an inorganic filler (D-2) which are chemically different from the inorganic filler (D-1) are contained, and in a case where the inorganic filler (D-1) is a boron nitride filler, a silica filler may be used as the inorganic filler (D-2), and in a case where the inorganic filler (D-1) is a silica filler, a boron nitride filler may be used as the inorganic filler (D-2).

Boron Nitride Filler

As described above, as the inorganic filler (D-1), a boron nitride filler is particularly preferred, however, any filler containing boron nitride may be used so long as it has a volume average particle size of at least 0.1 μm and at most 10 μm. More specifically, for example, particles of boron nitride having a specific crystal structure (hereinafter sometimes referred to simply as specific crystalline BN particles) may be used, boron nitride agglomerated particles obtained by aggregating boron nitride by granulation (hereinafter sometimes referred to simply as agglomerated BN particles) may be used, or one containing a component other than boron nitride such as a metal oxide which functions as a binder may be used. Although the specific crystalline BN particles may be used as the material of the agglomerated BN particles, the material of the agglomerated BN particles is not particularly limited to the specific crystalline BN particles, and boron nitride (material BN powder) as a material for production of the agglomerated BN particles which will be described in detail may also be used.

The volume average particle size of the boron nitride filler in the present invention may be measured by a conventional method for measuring the volume average particle size as described above. For example, the boron nitride filler is dispersed in a proper solvent, the particle size distribution is measured e.g. by a laser diffraction/scattering type particle size distribution measuring apparatus, and from the obtained particle size distribution, the volume average particle size of the boron nitride filler is obtained.

The main purpose of addition of the boron nitride filler to the interlayer filler composition of the present invention is particularly improvement of the thermal conductivity, and when the boron nitride filler in combination with the aftermentioned inorganic filler (E) is contained between layers of a three dimensional integrated circuit, it contributes to achievement of high thermal conductivity and a low coefficient of linear expansion simultaneously.

[Specific Crystalline BN Particles]

As the boron nitride filler of the present invention, specific crystalline BN particles are preferably used. The sizes of a crystallite of the specific crystalline BN particles are crystallite sizes of the 002 plane and the 100 plane, respectively, and the crystallite size (Lc) of the 002 plane can be obtained by measuring the half value width of a peak at 2θ=26.5° in X-ray diffraction, and in accordance with the following formula (ii). The crystallite size (La) of the 100 plane can also be obtained by measuring the half value width of a peak at 2θ=41.5° in X-ray diffraction, and in accordance with the following formula (ii):

$$L(\text{Å})=(0.9\lambda \cdot 180)/(\beta \cdot \cos \theta \cdot \pi) \quad \text{(ii)}$$

λ: 1.54056 Å
β: Peak half value width

The specific crystalline BN particles of the present invention have a crystallite size (La) of the 100 plane of at least 500 [Å]. By the La being at least 500 [Å], the crystallite interface is sufficiently small, whereby high thermal conductivity can be obtained. The La is more preferably at least 550 [Å], particularly preferably at least 600 [Å], with a view to further increasing the thermal conductivity.

On the other hand, from the viewpoint of industrial productivity, the La is preferably at most 2,000 [Å], more preferably at most 1,000 [Å].

This La can be adjusted, in production of the specific crystalline BN particles of the present invention, by subjecting hexagonal boron nitride having La less than 500 Å for example to heat treatment in a non-oxidizing gas at a temperature of usually from 1,300 to 2,300° C., preferably from 1,500 to 2,100° C., more preferably from 1,800 to 2,000° C. In order to increase La, heat treatment is carried out for a long time at a temperature as high as possible within the above temperature range.

The specific crystalline BN particles of the present invention have a crystallite size (Lc: hexagonal mesh lamination direction) of the 002 plane of at least 450 [Å]. By the Lc being at least 450 [Å], the crystallite interface is sufficiently small, whereby high thermal conductivity can be obtained. The Lc is more preferably at least 470 [Å], particularly preferably at least 500 [Å] with a view to further increasing the thermal conductivity.

On the other hand, from the viewpoint of industrial productivity, the Lc is preferably at most 2,000 [Å], more preferably at most 1,000 [Å].

This Lc can be adjusted, in production of the agglomerated BN particles of the present invention, by subjecting hexagonal boron nitride having Lc less than 450 Å for example to heat treatment in a non-oxidizing gas at a temperature of usually from 1,500 to 2,300° C., preferably from 1,800 to 2,100° C. In order to increase Lc, a method of using the above material hexagonal boron nitride having an oxygen content of less than 1.0 wt % may preferably be employed.

Of the agglomerated BN particles of the present invention, the relation between the Lc and the La satisfies the following relational expression (i):

$$0.70 \leq Lc/La \quad \text{(i)}$$

The above relational expression (i) indicates the shape anisotropy of the specific crystalline BN particles of the present invention, and the closer to 1 the Lc/La is, the smaller the shape anisotropy is.

By the specific crystalline BN particles of the present invention satisfying the above relational expression (i), an increase of the viscosity of a composition containing such particles and a resin can be prevented. Further, an increase in the viscosity of a composition containing agglomerated boron nitride particles formed by using the specific crystalline BN particles of the present invention as a material and a resin can be prevented. The relation between Lc and La is more preferably 0.75≤Lc/La, particularly preferably 0.78≤Lc/La. On the other hand, the relation between Lc and La is preferably Lc/La≤1.2 from the viewpoint of reducing the shape anisotropy.

(Oxygen Content of Specific Crystalline BN Particles)

The specific crystalline BN particles of the present invention has an oxygen content of preferably at most 0.30 wt %. By the specific crystalline BN particles having an oxygen content of at most 0.30 wt %, a composition containing such particle and a resin has a preferred coefficient of thermal conductivity. The oxygen content is more preferably at most 0.25 wt %, particularly preferably at most 0.15 wt %. On the other hand, the lower limit of the oxygen content is usually 0.01 wt %.

The oxygen content of the specific crystalline BN particles of the present invention within such a range can be achieved, in the process for producing the specific crystalline BN particles, by firing in a non-oxidizing gas atmosphere. Firing in a nitrogen gas atmosphere is particularly preferred to reduce the oxygen content.

The oxygen content of the specific crystalline BN particles of the present invention can be measured by an oxygen/nitrogen analyzer manufactured by HORIBA, Ltd. by an inert gas fusion-infrared absorption method.

(Volume Average Particle Size of Specific Crystalline BN Particles)

The specific crystalline BN particles of the present invention preferably have a volume average particle size of at most 10 μm. Further, the specific crystalline BN particles of the present invention more preferably have a volume average particle size of at most 7 μm, further preferably at most 5 μm, particularly preferably at most 4 μm. On the other hand, the volume average particle size is preferably at least 0.1 μm, with a view to obtaining favorable thermal conductivity and favorable fluidity.

The volume average particle size of the specific crystalline BN particles of the present invention can be measured for example by dispersing the particles in a proper solvent and measuring the particle size distribution e.g. by a laser diffraction/scattering type particle size distribution measuring apparatus, and from the obtained particle size distribution, the volume average particle size of the specific crystalline BN particles can be obtained. Specifically for example, measurement may be carried out by a laser diffraction/scattering type particle size distribution measuring apparatus ("LA-920" manufactured by HORIBA, Ltd.).

(Process for Producing Specific Crystalline BN Particles)

As the material to be used to obtain the specific crystalline BN particles of the present invention, any of commercially available hexagonal boron nitride, commercially available α- or β-boron nitride, boron nitride prepared by a reduction nitridation method of a boron compound and ammonia, boron nitride prepared from a boron compound and a nitrogen-containing compound such as melamine, and boron nitride prepared from sodium borohydride and ammonium chloride may be used without any restriction, and hexagonal boron nitride is particularly preferably used. Among such materials, in order that the specific crystalline BN particles of the present invention have predetermined crystallite sizes, the material is particularly preferably hexagonal boron nitride particularly having La of at least 300 [Å], and more preferably having Lc of at least 250 [Å] and Lc/La of from 0.8 to 1.0.

The specific crystalline BN particles of the present invention can be obtained by firing the above materials in a non-oxidizing gas atmosphere at a temperature of from 1,800° C. to 2,300° C.

The non-oxidizing gas may, for example, be nitrogen gas, helium gas, argon gas, ammonia gas or carbon monoxide, and is particularly suitably nitrogen gas.

The firing time is at a level of from 1 hour to 20 hours, more preferably from 3 to 15 hours, particularly preferably from 5 to 15 hours.

The firing temperature and the firing time may properly be adjusted so that both Lc and La of the specific crystalline BN particles of the present invention are large.

Further, a furnace to be used for firing is particularly preferably a carbon furnace, and a crucible in which hexagonal boron nitride is put at the time of firing is particularly preferably made of carbon.

Further, at the time of firing, an additive may be added within a range not to impair the desired crystal growth of hexagonal boron nitride.

Further, the specific crystalline BN particles immediately after production may not satisfy the above range of the particle size since the obtained particles are further agglomerated. Accordingly, the specific crystalline BN particles are preferably ground to satisfy the above range of the particle size.

The method for grinding the specific crystalline BN particles is not particularly limited, and a known grinding method such as a method of stirring and mixing the particles together with grinding media such as zirconia beads or jet spraying may be employed.

In a case where the specific crystalline BN particles of the present invention are contained in the composition, such specific crystalline BN particles may be used alone, or two or more kinds of the specific crystalline BN particles differing in the physical properties may be used in combination, or further, the agglomerated BN particles of the present invention may be used in combination.

[Agglomerated BN Particles]

The agglomerated boron nitride particles (agglomerated BN particles) of the present invention have a specific surface area of at least 10 m$^2$/g and a total pore volume of at most 2.15 cm$^3$/g, and their surface is constituted by boron nitride primary particles having an average particle size of at least 0.05 μm and at most 1 μm.

The agglomerated BN particles of the present invention have an average particle size of at most 10 μm, and preferably at most 7 μm, more preferably at most 5 μm, particularly preferably at most 4 μm. On the other hand, the average particle size is preferably usually at least 0.1 μm, and with a view to obtaining favorable thermal conductivity and favorable fluidity, preferably at least 0.3 μm.

The average particle size of the agglomerated BN particles of the present invention may be measured by a laser diffraction/scattering type particle size distribution measuring apparatus ("LA-920" manufactured by HORIBA, Ltd.) with respect to a dispersion of the agglomerated BN particles in a proper solvent. The volume average particle size of the agglomerated BN particles can be obtained from the obtained particle size distribution.

The agglomerated BN particles of the present invention usually have a total pore volume of at most 2.15 cm$^3$/g. By the total pore volume being small, the agglomerated BN particles are densely agglomerated, whereby the interface which inhibits thermal conductivity can be made small, and agglomerated BN particles having further higher thermal conductivity can be obtained.

The total pore volume of the agglomerated BN particles is usually at most 2.15 cm$^3$/g, preferably at least 0.3 cm$^3$/g and at most 2.00 cm$^3$/g, more preferably at least 0.5 cm$^3$/g and at most 1.95 cm$^3$/g. Further, the specific surface area of the agglomerated BN particles is usually at least 20 m$^2$/g, and is preferably at least 20 m$^2$/g and at most 50 m$^2$/g, more preferably at least 25 m$^2$/g and at most 30 m$^2$/g.

The total pore volume of the agglomerated BN powder may be measured by a mercury intrusion technique, and the specific surface area may be measured by a BET one point method (absorption gas: nitrogen).

The total pore volume and the specific surface area of the material BN powder can be measured specifically by the method disclosed in the after-mentioned Examples.

The agglomerated BN particles of the present invention are preferably spherical. In the present invention, "spherical" means particles granulated by agglomerating the after-mentioned material BN powder into a shape with an aspect ratio (the ratio of the major axis to the minor axis) being at least 1 and at most 2, preferably at least 1 and at most 1.5, not primary particles. That is, in the present invention, "spherical" or "spherical shape" mean an aspect ratio being at least 1 and at most 2. This aspect ratio is preferably at least 1 and at most 1.5. The aspect ratio of the granulated agglomerated BN particles is determined by optionally selecting at least 200 particles from an image taken by a scanning electron microscope (SEM), obtaining the ratios of the major axis to the minor axis of the respective particles and calculating their average.

With respect to the particle size of the granulated particles obtained by granulation, the volume-based average particle size $D_{50}$, is preferably from 2 to 20 μm, particularly preferably from 5 to 10 μm, in order that the agglomerated BN particles of the present invention after heat treatment have a preferred volume-based maximum particle size within a range of from 0.1 μm to 25 μm. The volume-based average particle size $D_{50}$ of the granulated particles can be measured, for example, by "Microtrac HRA" manufactured by NIKKISO CO., LTD.

The agglomerated BN particles immediately after production may not satisfy the above range of the particle size in some cases since the obtained particles are further agglomerated. Thus, the agglomerated BN particles are preferably ground to satisfy the above range of the particle size.

The method for grinding the agglomerated BN particles is not particularly limited, and a known grinding method such as a method of stirring and mixing the particles together with grinding media such as zirconia beads or jet spraying may be employed.

In a case where the agglomerated BN particles of the present invention are contained in the composition, such agglomerated BN particles may be used alone, or two or more kinds of the agglomerated BN particles differing in the physical properties may optionally be combined, or further, the specific crystalline BN particles of the present invention may be used in combination.

For example, two or more kinds of the agglomerated BN particles differing in the average particle size may be used. That is, by use of agglomerated BN particles having a relatively small particle size, for example, from 0.1 to 2 µm, preferably from 0.2 to 1.5 µm, and agglomerated BN particles having a relatively large average particle size, for example, from 1 to 5 µm, preferably from 1 to 3 µm, in combination, thermally conductive paths of the agglomerated BN particles having a large average particle size are connected by the agglomerated BN particles having a small average particle size, high filling becomes possible as compared with a case of using only one having a single average particle size, and higher thermal conductivity can be obtained.

In such a case, it is preferred to use the agglomerated BN particles having a small average particle size and the agglomerated BN particles having a large particle size in a weight ratio of from 10:1 to 1:10, in view of formation of thermally conductive paths. Further, in a case where the agglomerated BN particles are used as the boron nitride filler, the agglomerated BN particles may be properly subjected to surface treatment to increase the dispersibility in the resin (A) or in the coating fluid.

[Process for Producing Agglomerated BN Particles]

In the present invention, the process for producing the agglomerated BN particles is not limited, however, it preferably comprises a grinding step of grinding the material BN powder, a granulation step of agglomerating the powder, and a heating step of subjecting the granules to heat treatment. More specifically, the BN powder as the material is once dispersed in a medium to prepare a slurry of the material BN powder (in this specification sometimes referred to simply as "BN slurry"), followed by grinding treatment, and using the obtained slurry, spherical particles are granulated, and heat treatment is carried out for crystallization of the agglomerated BN granulated particles.

(Material BN Powder)

In the present invention, as boron nitride (in this specification sometimes referred to simply as "agglomerated BN particles) as the material in production of the agglomerated BN particles, any of commercially available hexagonal BN nitride, commercially available α- or β-BN, BN prepared by a reduction nitridation method of a boron compound and ammonia, BN prepared from a boron compound and a nitrogen-containing compound such as melamine, and BN prepared from sodium borohydride and ammonium chloride may be used without any restriction. Hexagonal boron nitride is particularly preferably used.

From the viewpoint of crystal growth of hexagonal boron nitride, oxygen is preferably present to a certain extent in the material BN powder such as hexagonal boron nitride to be the material, and for the agglomerated BN particles of the present invention, it is preferred to use as the material BN powder one having a total oxygen content of at least 1 wt % and at most 10 wt %, more preferably at least 3 wt % and at most 10 wt %, further preferably at least 3 wt % and at most 9 wt %.

With the BN powder having a total oxygen content within the above range, crystals are likely to grow by the heat treatment since the primary particle size is small and the crystals have not been developed in many cases. In the present invention, it is preferred to grow BN crystals by subjecting agglomerated BN particles having the material BN powder agglomerated by granulation to heat treatment, and by using the material BN powder having a total oxygen content within the above range, the primary particles of the BN crystal can be grown in a normal direction so that the a-axes face outward, that is, the BN primary particles can be radially arranged on the agglomerated BN particle surface.

If the total oxygen content of the material BN powder is less than the above lower limit, since the purity and the crystallinity of the material BN powder itself are good, the crystal growth of the C-plane will not sufficiently be achieved, the BN primary particles cannot be radially arranged on the agglomerated BN particle surface. On the other hand, if the total oxygen content exceeds the above upper limit, the oxygen content is high even after the heat treatment, and when the resulting agglomerated particles are used as the boron nitride filler of the composition, high thermal conductivity cannot be achieved.

Accordingly, when such agglomerated BN particles are used as the boron nitride filler of the composition to form a filling interlayer, thermally conductive paths are likely to form by contact of highly thermally conductive planes (C-planes) of hexagonal boron nitride via the a-axes in the filling interlayer, and thus high thermal conductivity even in a direction of the thickness of the filling interlayer can be obtained.

To adjust the total oxygen content of the material BN powder within the above range, a method of preparing BN at a low temperature of at most 1,800° C. may, for example, be mentioned.

Further, as the material BN powder having a total oxygen content within the above preferred range, commercially available products may be used, and for example, hexagonal boron nitride "ABN" manufactured by NISSHIN REFRATECH CO., LTD. or hexagonal boron nitride "AP170S" manufactured by MARUKA CORPORATION may be mentioned.

The oxygen content of the material BN powder used in the present invention may be measured by an oxygen/nitrogen analyzer manufactured by HORIBA, Ltd. by an inert gas fusion-infrared absorption method.

Further, the material BN powder preferably satisfies the following (1) and/or (2):

(1) the total pore volume is at most $1.0 \text{ cm}^3/\text{g}$;
(2) the specific surface area is at least $20 \text{ m}^2/\text{g}$.

By the total pore volume being at most $1.0 \text{ cm}^3/\text{g}$, the BN powder is dense, whereby when such a powder is used as primary particles constituting the agglomerated BN particles, granulation with high sphericity can be achieved. Further, by the specific surface area being at least $20 \text{ m}^2/\text{g}$, the dispersed particle size in the BN slurry to be used at the time of formation into spheres by granulation can be made small, such being favorable.

In the present invention, the total pore volume of the material BN powder is preferably at most $1.0 \text{ cm}^3/\text{g}$, more preferably at least $0.3 \text{ cm}^3/\text{g}$ and at most $1.0 \text{ cm}^3/\text{g}$, particularly preferably at least $0.5 \text{ cm}^3/\text{g}$ and at most $1.0 \text{ cm}^3/\text{g}$. Further, in the present invention, the specific surface area of the material BN powder is preferably at least $20 \text{ m}^2/\text{g}$, more preferably at least $20 \text{ m}^2/\text{g}$ and at most $500 \text{ m}^2/\text{g}$, particularly preferably at least $50 \text{ m}^2/\text{g}$ and at most $200 \text{ m}^2/\text{g}$.

The total pore volume of the material BN powder may be measured by a mercury intrusion technique, and the specific surface area may be measured by a BET one point method (adsorption gas: nitrogen).

The total pore volume and the specific surface area of the material BN powder are specifically measured by the method disclosed in the after-mentioned Examples.

Further, among the above material BN powders, it is particularly preferred to use a BN powder having La of at least 300[Å], more preferably Lc of at least 250[Å], and Lc/La of from 0.8 to 1.0, in order that the agglomerated BN particles of the present invention have predetermined crystallite sizes.

(Preparation of BN Slurry)

The medium to be used for preparation of the BN slurry is not particularly limited, and water and/or various organic solvents may be used. In view of easiness of spray drying, simplification of an apparatus, etc., water (pure water) is preferably used.

The amount of use of water is preferably from 1 to 20 times by weight, particularly preferably from 1 to 10 times by weight, to the material BN powder, since if it is too large, a load at the time of spray drying tends to increase, and if it is too small, uniform dispersion tends to be difficult.

(Surfactant)

To the BN slurry, various surfactants may be added with a view to suppressing an increase in the viscosity of the slurry at the time of after-mentioned grinding treatment and from the viewpoint of the dispersion stability (suppression of agglomeration) of the BN particles.

As the surfactant, an anionic surfactant, a cationic surfactant, an nonionic surfactant and the like may be used. They may be used alone or as a mixture of at least two.

In a case where a surfactant is added to the BN slurry, the surfactant concentration in the BN slurry is preferably at least 0.1 wt % and at most 10 wt %, particularly preferably at least 0.5 wt % and at most 5 wt %. By the concentration in the BN slurry being at least the lower limit, the above effects by addition of the surfactant will sufficiently be obtained, and by the concentration being at most the upper limit, the influence of the remaining carbon can be minimized at the time when a BN slurry having a high BN powder content is prepared, followed by granulation and heat treatment.

The surfactant may be added before the following grinding treatment or may be added after the grinding treatment.

(Binder)

The BN slurry preferably contains a binder in order to effectively granulate material BN powder into agglomerated particles. A binder basically acts to firmly bind the BN powder, the particles of which have no adhesion to one another, and to stabilize the shape of the granulated particles.

The binder to be used for the BN slurry is not limited so long as it increases the adhesion of the BN particles, and in the present invention, since the granulated particles are subjected to heat treatment after being agglomerated, the binder is preferably one having heat resistance to the high temperature conditions in the heat treatment procedure.

Such a binder is preferably a metal oxide, and specifically, preferably used is aluminum oxide, magnesium oxide, yttrium oxide, calcium oxide, silicon oxide, boron oxide, cerium oxide, zirconium oxide, titanium oxide or the like. Among them, from the viewpoint of the thermal conductivity and the heat resistance as an oxide, the binding power to bind the BN particles, etc., aluminum oxide or yttrium oxide is suitable. Further, as the binder, a liquid binder such as alumina sol may be used.

Such binders may be used alone or as a mixture of at least two.

The amount of use of the binder (in a case of a liquid binder, the amount of use as the solid content) is preferably at least 1 wt % and at most 30 wt %, more preferably at least 1 wt % and at most 20 wt %, further preferably at least 5 wt % and at most 20 wt % to the BN powder in the BN slurry.

If the amount of use of the binder is less than the above lower limit, the effects to bind the BN particles tend to be small, whereby the granulated particles may not maintain the shape after granulation, and if it exceeds the upper limit, the content of BN in the granulated particles tends to be low, whereby not only the crystal growth is influenced but also when such particles are used as a thermally conductive filler, the effect to improve the coefficient of thermal conductivity may be small.

(Grinding Treatment)

The BN slurry may be subjected to a granulation step by spray drying as it is, however, it is preferred, prior to granulation, to subject the BN particles of the material BN powder in the slurry to grinding treatment to make the BN particles smaller. By grinding the BN particles and making them smaller, agglomeration will smoothly be carried out. That is, depending on the particle size of the material BN powder, if the material BN powder is dispersed as it is in a medium, many particles will not be granulated in the agglomeration step since the BN particles are in a plate shape, however, by making the BN particles smaller, effective agglomeration will be carried out.

For grinding, a conventional grinding method by a bead mill, a ball mill, a pin mill or the like may be employed, and preferred is a bead mill from the viewpoint such that circulating grinding of a large quantity of a slurry is possible and the ground particle size can easily be controlled. Further, since the viscosity of the BN slurry is increased by making the BN particles smaller by grinding, one capable of grinding at a higher concentration with a high viscosity is preferred, and in addition, since the temperature of the BN slurry is also increased along with progress of grinding, one equipped with a cooling system is preferred. The grinding apparatus may, for example, be "OB Mill" manufactured by FREUND-TURBO CORPORATION or "Star Mill LMZ series" manufactured by Ashizawa Finetech Ltd.

In the present invention, the BN particles are ground so that the volume-based average particle size $D_{50}$ of the material BN powder in the BN slurry is at most ⅕ of the volume-based average particle size $D_{50}$ of spherically granulated BN particles. If the volume-based average particle size $D_{50}$ of the BN powder in the BN slurry is larger than ⅕ of the volume-based average particle size $D_{50}$ of the granulated particles, since the BN particles are in a plate shape, many particles will not be granulated into spheres in the granulation step of forming the particles into spheres, and the strength of the particles after granulation tends to be weak. Considering the grinding effect and the load of grinding, the volume-based average particle size $D_{50}$ of the BN particles in the BN slurry to be subjected to grinding is preferably from 1/100 to ⅕, particularly preferably from 1/50 to ⅕ of the volume-based average particle size $D_{50}$ of the granulated particles obtained by granulation of the BN slurry.

The volume-based average particle size $D_{50}$ of the BN dispersed particles in the BN slurry can be measured by a laser diffraction/scattering type particle size distribution measuring apparatus (e.g. "LA-920" manufactured by HORIBA, Ltd., Microtrac "FRA", "HRA", "MT3300EX", "UPA-EX150" manufactured by NIKKISO CO., LTD., or Nanotrac "UPA-EX150" manufactured by NIKKISO CO., LTD.), for example, with respect to a dispersion of the slurry after grinding in a proper solvent.

(Granulation (Agglomeration))

To obtain granulated particles as the agglomerated BN particles from the BN slurry, a spray drying method is preferably used. By the spray drying method, it is possible to produce granulated particles having a desired size, and it is also possible to obtain spherical granulated particles, by controlling the concentration of the slurry as the material, the liquid amount per unit time sent to the apparatus, and the air pressure and the air amount at the time of spraying the sent slurry. The spray drying apparatus to be used for formation into spheres is not particularly limited, and in order to obtain further smaller spherical BN granulated particles, most preferred is one having a four-fluid nozzle. Such an apparatus may, for example, be "MDL-050M" manufactured by Fujisaki Electric Co., Ltd.

(Heat Treatment)

The granulated particles of boron nitride obtained by granulation are preferably further subjected to heat treatment in a non-oxidizing gas atmosphere.

Here, the non-oxidizing gas atmosphere is an atmosphere of e.g. nitrogen gas, helium gas, argon gas, ammonia gas, hydrogen gas, methane gas, propane gas or carbon monoxide gas. The rate of crystallization of the agglomerated BN particles varies depending upon the type of the atmospheric gas used, and for example, in an argon gas, the rate of crystallization tends to be low, and the heat treatment time will be long. In order to carry out crystallization in short time, particularly a nitrogen gas or a mixed gas of a nitrogen gas with another gas is preferably used. By properly selecting the heat treatment conditions, it is possible to arrange boron nitride primary particles having an average particle size of at most 1 μm on the surface and radially in addition, while the specific surface area and the total pore volume of the agglomerated BN particles of the present invention are within specific ranges.

The heat treatment temperature is usually from 1,300° C. to 2,100° C., preferably from 1,300° C. to 2,000° C., further preferably from 1,400° C. to 2,000° C. If the heat treatment temperature is less than the above lower limit, crystallization of hexagonal boron nitride tends to be insufficient, an amorphous portion where crystallization is undeveloped remains, and the effect to improve the coefficient of thermal conductivity when the particles are used as a thermally conductive filler tends to be small. If the heat treatment temperature exceeds the above upper limit, the added binder component tends to be molten/decomposed and the agglomerated BN particles are agglomerated, whereby the original shape may not be maintained, or decomposition of BN may occur.

The heat treatment time is usually at least 1 hour and at most 50 hours, more preferably from 3 to 40 hours, particularly preferably from 5 to 30 hours. Further, it is preferred to introduce a holding step particularly at from 1,300 to 1,500° C. for at least 3 hours within the above heat treatment time. By introducing a holding step within the above temperature, crystallization of hexagonal boron nitride will be carried out more efficiently, whereby the above heat treatment temperature tends to be decreased. If the heat treatment time is less than the above lower limit, crystallization tends to be insufficient, and if it exceeds the above upper limit, hexagonal boron nitride may partially be decomposed.

The heat treatment is preferably carried out in a non-oxidizing gas atmosphere, and for this purpose, it is usually preferred that a furnace is heated while it is evacuated of air with a vacuum pump until decompose gas and the like due to heating are reduced, and then while a non-oxidizing gas is introduced, the furnace is continuously heated to the desired temperature. The temperature at which the furnace is evacuated of air with a vacuum pump is at a level of from 200 to 500° C., for example, it is preferred that the furnace is heated to the vicinity of 400° C. over from about 30 to about 60 minutes, and the furnace is evacuated of air for from about 30 to about 60 minutes at the temperature, and the furnace is vacuumed to a degree of vacuum of at most 10 Pa, and then, a non-oxidizing gas is introduced. The flow rate of the non-oxidizing gas depends on the size of the furnace and is usually at least 2 L (liter)/min. Then, while the non-oxidizing gas is introduced, the furnace is heated to about 1,500° C. at a rate of from 50 to 100° C./hour and then heated from 1,500° C. to the predetermined heat treatment temperature at a rate of from 30 to 50° C./hour. The granulated particles are preferably heated at the above temperature for the above heat treatment time and then cooled to room temperature at a rate of from about 5 to about 50° C./min.

For example, in the case of heat treatment in a nitrogen gas atmosphere, heat treatment is carried out at about 2,000° C. for about 5 hours, and in the case of an argon gas atmosphere, the heat treatment is carried out at about 2,000° C. for from about 5 to about 15 hours, whereby the primary particles of the BN crystal can have an average particle size of at most 1 μm and can be grown radially.

A firing furnace for the heat treatment may be a batch furnace such as a muffle furnace, a tube furnace or an atmosphere furnace, or a continuous furnace such as a rotary kiln, a screw conveyer furnace, a tunnel furnace, a belt furnace, a pressure furnace or a vertical continuous furnace, depending upon the purpose of use.

(Classification)

The agglomerated BN particles after the above heat treatment are preferably subjected to classification treatment in order to decrease the average particle size and to suppress an increase in the viscosity when the particles are blended in a composition. This classification is usually carried out after the heat treatment of the granulated particles, however, the granulated particles before the heat treatment may be subjected to classification and then subjected to the heat treatment.

The classification may be either wet classification or dry classification, however, with a view to suppressing decomposition of hexagonal boron nitride, dry classification is preferred. Particularly in a case where the binder is water-soluble, dry classification is preferably employed.

Dry classification may be classification by sieving and in addition, air classification utilizing a difference between the centrifugal force and the fluid drag, and from the viewpoint of classification accuracy, air classification is preferred, and a classifier such as a swirling airflow type classifier, a forced vortex centrifugal classifier or a hemi-free vortex centrifugal classifier may be used. The classifier may properly be selected depending upon the particle size of the particles to be classified, for example, a swirling airflow type classifier for classification of small fine particles in a submicron to a single micron region, and a hemi-free vortex centrifugal classifier for classification of relatively large particles larger than the above.

In the present invention, preferably, classification operation is carried out by using a swirling airflow type classifier in order to obtain agglomerated BN particles having a volume-based maximum particle size of at least 0.1 μm and at most 25 μm.

(Physical Properties of Agglomerated BN Particles)

As described above, by granulating the material BN powder and carrying out heat treatment, it is possible to grow crystals of hexagonal boron nitride while the shape is maintained, and to arrange boron nitride primary particles having an average particle size of at most 1 μm on the surface while the specific surface area and the total pore volume are within specific ranges. Further, it is possible to prepare agglomerated BN particles of the present invention in which BN primary particles having an average particle size of at most 1 μm are radially arranged from the center toward the surface side of each agglomerated particle on the agglomerate particle surface, that is, the primary particles of the BN crystal are arranged in a normal direction so that the a-axes face outward.

Here, on the surface of the agglomerated BN particles of the present invention, boron nitride primary particles having an average particle size of at most 1 μm are preferably present, and "at most 1 μm" of "the BN primary particles having an average particle size of at most 1 μm" means the length corresponding to the particle size of the BN primary particles. This size of the crystal of the BN primary particles can be obtained in such a manner that the primary particles are observed with a scanning electron microscope (SEM) at a magnification of about 20,000 times, maximum particle sizes of optional 100 particles observed on the surface are measured, and their average is obtained.

In the agglomerated BN particles of the present invention, how the crystal grows is an important factor in application to a highly thermally conductive filler. In the case of the agglomerated BN particles of the present invention, particles formed by such specific crystal growth are preferred from the viewpoint of the isotropy of the thermal conductivity, the kneading property with a resin, and excellent disintegration resistance.

The agglomerated BN particles of the present invention preferably have their surface covered with fine BN primary crystals having an average particle size of at most 1 μm, and preferably have a specific surface area and a total pore volume within specific ranges. Further, it is preferred that fine BN primary crystals having an average particle size of at most 1 μm are radially arranged, that is, primary particles of the BN crystal are arranged in a normal direction so that the a-axes face outward. As one means for preparing such agglomerated BN particles, it is important to use a hexagonal boron nitride powder having a total oxygen content of at least 1 wt % and at most 10 wt % as the material and to control the heat treatment conditions as described above.

That is, agglomerated BN particles prepared by using a hexagonal boron nitride powder having a total oxygen content less than 1 wt % as the material and the agglomerated BN particles of the present invention are totally different in the crystal structure on the agglomerated BN surface, and are totally different in the crystal growth direction of hexagonal boron nitride.

Specifically, in the agglomerated BN particles of the present invention, hexagonal boron nitride crystal grows radially from the center to each sphere, that is, primary particles of the BN crystal grow in a normal direction so that the a-axes face outward, whereas in a case where material hexagonal boron nitride having a total oxygen content less than 1 wt % is used, the crystal grows in a circumferential direction (so that the C-planes of hexagonal boron nitride face outward), and as a result, the specific surface area is small and the total pore volume is large.

Further, when the agglomerated BN of the present invention is blended in a composition as the boron nitride filler, assuming that the packing amount is the same, the coefficient of thermal conductivity in a direction of the thickness of the filling interlayer to be formed can drastically be improved. This is estimated to be because in hexagonal boron nitride of the present invention, effective thermally conductive paths are likely to form in the filling interlayer by the contact of highly thermally conductive planes (C-planes or 002 planes) of fine hexagonal boron nitride primary particles on the surface of spheres via the a-axes. Such crystal growth is attained by a relatively high total oxygen content of the material hexagonal boron nitride powder itself and by re-crystallization from a state with low crystallinity, and in a case where a hexagonal boron nitride material having a low total oxygen content and good crystallinity is used, radial hexagonal boron nitride crystal growth will not substantially occur.

Further, by using a material having a high total oxygen content and low crystallinity, formation into fine particles at the time of grinding will smoothly be carried out, and in addition, improvement in the sphericity by granulation will be achieved, and effective classification into a volume-based maximum particle size within a range of at least 0.1 μm and at most 25 μm will easily be carried out in the classification step after heat treatment.

Further, the agglomerated BN particles of the present invention are obtained by using a metal oxide as a binder and have a relatively small pore volume and a relatively high bulk density as granulated particles, whereby they are excellent in a miscibility with a resin and can be packed densely, and further, their disintegration at the time of kneading with a resin can be prevented.

As described above, when the agglomerated BN particles of the present invention in which the BN crystal is grown radially from the center side of each spherical particle, are used for a composition, by formation of thermally conductive paths derived from the direction of growth of the BN crystal, a remarkably high effect to improve the thermal conductivity can be obtained even though the particles are fine particles.

Further, in the filling interlayer formed by using the agglomerated BN particles of the present invention, anisotropy of the thermal conductivity which has been problematic can remarkably be improved.

(Crystal Structure of Agglomerated BN Particles, their Surface and Average Particle Size)

In the present invention, the crystal structure of the agglomerated BN particles can be confirmed by powder X-ray diffraction measurement, and the direction of crystal growth of the BN primary particles on the surface of the agglomerated BN particles can be confirmed by a scanning electron microscope (SEM). Further, the average particle size of agglomerated BN can be measured e.g. by a laser diffraction/scattering type particle size distribution measuring apparatus with respect to a sample having the agglomerated BN particles dispersed in pure water medium containing sodium hexametaphosphate as a dispersion stabilizer.

(Volume-Based Maximum Particle Size of Agglomerated BN Particles)

The particle size distribution of the agglomerated BN particles may also be measured by a known particle size distribution measuring apparatus in the same manner as the inorganic filler (D). Specifically for example, the interlayer filler composition is dispersed in cyclohexanone at a desired concentration, and the volume particle size distribution is measured by a particle size distribution measuring apparatus ("SALD-2200", manufactured by Shimadzu Corporation). From the obtained particle size distribution, the average particle size of the inorganic filler after grinding can be obtained.

The agglomerated BN particles of the present invention have a volume-based maximum particle size of preferably from 0.1 to 25 μm, particularly preferably from 2 to 10 μm, especially preferably from 4 to 10 μm. By the maximum particle size of the agglomerated BN particles being at most the above upper limit, when such particles are used as the boron nitride filler for a composition, a filling interlayer without surface roughening can be formed. Further, formation of a thin filling interlayer is possible, and such a composition is suitably used for application of a thin film, and the thermal conductivity in a direction of the thickness of the coating film can be increased. By the agglomerated BN having a maximum particle size smaller than the above lower limit, the effect to improve the thermal conductivity as a thermally conductive filler tends to be small.

Here, the volume-based average particle size $D_{50}$ of the agglomerated BN particles of the present invention is not particularly limited, and from the same reason as for the above volume-based maximum particle size, it is preferably from 1 to 20 μm, particularly preferably from 1 to 10 μm.

Particularly the agglomerated BN particles as the bopron nitride filler preferably have an average particle size $D_{50}$ of from 0.1 to 5 μm and a maximum particle size of at most 10 μm, more preferably an average particle size $D_{50}$ of from 0.3 to 4.5 μm and a maximum particle size of at most 9.5 μm, further preferably an average particle size $D_{50}$ of from 0.5 to 4 μm and a maximum particle size of at most 9 μm.

Usually, in a three-dimensional integrated circuit, for further improvement in the performance such as speeding up and an increase in the capacity, the distance between the respective chips is so small as a level of from 10 to 50 μm. In the filling interlayer between the chips, the maximum particle size of the filler to be blended is preferably at most ½ to ⅓ of the thickness of the filling interlayer.

If the maximum particle size of the boron nitride filler exceeds 10 μm, the boron nitride filler may protrude on a surface of the filling interlayer after curing, whereby the surface state of the filling interlayer tends to be deteriorated.

On the other hand, if the particle size of the boron nitride filler is too small, the number of necessary thermal conductive paths tends to increase, whereby the probability of the thermal conductive paths being connected from top to bottom in the thickness direction between the chips tends to be low, and the coefficient of thermal conductivity in the thickness direction of the filling interlayer may be insufficient even if combined with a resin (A) having high thermal conductivity.

Further, if the particle size of the boron nitride filler is too small, the boron nitride filler is likely to agglomerate, thus deteriorating the dispersibility in the composition or in the coating liquid. Further, by the average particle size $D_{50}$ of the boron nitride filler within the above range, excessive agglomeration of the filler particles can be suppressed, and a filling interlayer having a sufficient coefficient of thermal conductivity in the thickness direction can be obtained.

The volume-based maximum particle size and average particle size $D_{50}$ of the agglomerated BN particles of the present invention may specifically be measured by a method disclosed in the after-mentioned Examples.

The above agglomerated BN particles may be used alone or in combination of two or more kinds of agglomerated BN particles differing in the physical properties.

For example, two or more kinds of agglomerated BN particles differing in the average particle size $D_{50}$ may be used. That is, by using agglomerated BN particles having a relatively small average particle size $D_{50}$ of from 0.1 to 2 μm for example, preferably from 0.2 to 1.5 μm and agglomerated BN particles having a relatively large average particle size $D_{50}$ of from 1 to 5 μm for example, preferably from 1 to 3 μm in combination, thermally conductive paths of the agglomerated BN particles having a large average particle size $D_{50}$ are connected by the agglomerated BN particles having a small average particle size $D_{50}$, whereby high filling becomes possible as compared with a case of using only one having a single volume average particle size $D_{50}$, and higher thermal conductivity can be obtained.

In such a case, it is preferred to use the agglomerated BN particles having a small average particle size $D_{50}$ and the agglomerated BN particles having a large average particle size $D_{50}$ in a weight ratio of from 10:1 to 1:10, in view of formation of thermally conductive paths.

Further, the agglomerated BN particles as the boron nitride filler may be properly subjected to surface treatment for example by a silane coupling agent to increase the dispersibility in the resin (A) or in the coating liquid. The silane coupling agent is preferably one having as a functional group at least one group selected from a vinyl group, an epoxy group, an amino group, a ureido group, a mercapto group, a sulfide group and an isocyanate group. Particularly, one having an epoxy group or an amino group is preferred.

Silica Filler

As described above, as the inorganic filler (D-1), as well as the boron nitride filler, a silica filler is particularly preferred, and any filler containing silica may be used so long as it has a volume average particle size of at least 0.1 μm and at most 10 μm. More specifically, for example, crystalline silica obtained by grinding natural silica stone, quartz glass, fused silica or amorphous silica such as synthetic silica may, for example, be used. They may be used alone or as a mixture of at least two.

The main purpose of addition of a silica filler in the composition of the present invention is particularly improvement of the thermal conductivity, and when the silica filler in combination with the inorganic filler (D-2) is contained between layers in a layered semiconductor device, the silica filler contributes to achievement of high thermal conductivity and a low coefficient of linear expansion simultaneously.

The silica filler of the present invention has a volume average particle size of preferably at most 10 μm. Further, the silica filler of the present invention has a volume average particle size of more preferably at most 7 μm, further preferably at most 5 μm, particularly preferably at most 4 μm. On the other hand, the volume average particle size is preferably at least 0.1 μm, with a view to obtaining favorable thermal conductivity and favorable flowability.

The volume average particle size of the silica filler in the present invention may be obtained, in the same manner as the inorganic filler (D), from the particle size distribution measured by using a conventional particle size distribution measuring apparatus by dispersing the silica filler in a proper solvent and measuring the particle size distribution e.g. by a laser diffraction/scattering type particle size distribution measuring apparatus. Specifically for example, the interlayer filler composition is dispersed in cyclohexanone at a desired concentration, and the volume particle size distribution is measured by a particle size distribution measuring apparatus ("SALD-2200" manufactured by Shimadzu Corporation). From the obtained particle size distribution, the average particle size of the inorganic filler after grinding can be obtained. Further, for example, measurement may be carried out also by laser diffraction/scattering type particle size distribution measuring apparatus "LA-920" manufactured by HORIBA, Ltd.

Usually, the specific surface area of the silica filler is at least 0.1 m$^2$/g, and is preferably at least 0.1 m$^2$/g and at most 100 m$^2$/g, more preferably at least 0.5 m$^2$/g and at most 50 m$^2$/g, further preferably at least 1 m$^2$/g and at most 10 m$^2$/g.

Here, the specific surface area of the silica filler may be measured by a BET one point method (adsorption gas:

nitrogen). More specifically, the specific surface area of the silica filler is a value measured by the method disclosed in the after-mentioned Examples.

The silica filler in the present invention is preferably spherical. In the present invention, "spherical" means an aspect ratio (the ratio of the major axis to the minor axis) being at least 1 and at most 2. This aspect ratio is preferably at least 1 and at most 1.5. The aspect ratio of the particles is determined by optionally selecting at least 200 particles from an image taken by a scanning electron microscope (SEM), obtaining the ratios of the major axis to the minor axis of the respective particles and calculating their average.

The silica filler immediately after preparation may not satisfy the above range of the particle size in some cases since the obtained particles are further agglomerated. Thus, the silica filler is preferably ground to satisfy the above range of the particle size. The method for grinding the particles is not particularly limited, and a known grinding method such as a method of stirring and mixing the particles together with grinding media such as zirconia beads or jet spraying may be employed. Further, the obtained particles may be subjected to sieving to remove or to add particles having different particle sizes to adjust the volume average particle size.

In a case where the silica filler of the present invention is contained in a composition, such silica fillers may be used alone, or two or more kinds differing in the physical properties may optionally be combined.

Two or more kinds of the silica fillers differing in the average particle size may be used. That is, by use of a silica filler having a relatively small particle size, for example, from 0.1 to 2 μm, preferably from 0.2 to 1.5 μm, and a silica filler having a relatively large average particle size, for example, from 1 to 5 μm, preferably from 1 to 3 μm, in combination, thermally conductive paths of the silica filler having a large average particle size are connected by the silica filler having a small average particle size, whereby high filling becomes possible as compared with a case of using only one having a single average particle size, and highly thermal conductivity can be obtained.

In such a case, it is preferred to use the silica filler having a small average particle size and the silica filler having a large average particle size in a weight ratio of preferably from 10:1 to 1:10, in view of formation of thermally conductive paths. Further, in a case where the silica filler is used, it may be properly subjected to surface treatment to increase the dispersibility in the resin (A) or in the coating liquid.

(Volume-Based Maximum Particle Size)

The silica filler of the present invention have a volume-based maximum particle size of preferably from 0.1 to 20 μm, particularly preferably from 0.3 to 15 μm, especially preferably from 0.5 to 10 μm. By the maximum particle size of the silica filler being at most the above upper limit, when the silica filler is used as the boron nitride filler for a composition, a filling interlayer without surface roughening can be formed. Further, formation of a thin filling interlayer is possible, and such a composition is suitably used for application of a thin film, and the thermal conductivity in a direction of the thickness of the coating film can be increased. By the silica filler having a maximum particle size smaller than the above lower limit, the effect to improve the thermal conductivity as a thermally conductive filler tends to be small.

Here, the volume-based average particle size $D_{50}$ of the silica filler of the present invention is not particularly limited, and from the same reason as for the above volume-based maximum particle size, it is preferably from 0.1 to 20 μm, more preferably from 0.3 to 10 μm, particularly preferably from 0.5 to 5 μm.

Usually, in a layered semiconductor device, for further improvement in the performance such as speeding up and an increase in the capacity, the distance between the respective chips is so small as a level of from 10 to 50 μm. In the filling interlayer between the chips, the maximum particle size of the filler to be blended is preferably at most ½ to ⅓ of the thickness of the filling interlayer.

If the maximum particle size of the silica filler exceeds 10 μm, the silica filler may protrude on a surface of the filling interlayer after curing, whereby the surface state of the filling interlayer tends to be deteriorated.

On the other hand, if the particle size of the silica filler is too small, the number of necessary thermal conductive paths tends to increase, whereby the probability of the thermal conductive paths being connected from top to bottom in the thickness direction between the chips tends to be low, and the coefficient of thermal conductivity in the thickness direction of the filling interlayer may be insufficient even if combined with a resin (A) having high thermal conductivity.

Further, if the particle size of the silica filler is too small, the silica filler is likely to agglomerate, thus deteriorating the dispersibility in the composition or in the coating liquid. Further, by the average particle size $D_{50}$ of the silica filler within the above range, excessive agglomeration of the filler particles can be suppressed, and a filling interlayer having a sufficient coefficient of thermal conductivity in the thickness direction can be obtained.

<Inorganic Filler (D-2)>

The inorganic filler (D-2) is an inorganic filler which is chemically different from the inorganic filler (D-1) as described above, and one having a volume average particle size of at least 0.1 μm and at most 10 μm and having a volume average particle size different from the volume average particle size of the inorganic filler (D-1) is used.

The volume average particle size of the inorganic filler (D-2) is also obtained, in the same manner as the inorganic filler (D) and the inorganic filler (D-1), from the particle size distribution measured by a conventional particle size distribution measuring apparatus by dispersing the inorganic filler (D-2) in a proper solvent and measuring the particle size distribution e.g. by a laser diffraction/scattering type particle size distribution measuring apparatus. Specifically for example, the interlayer filler composition is dispersed in cyclohexanone at a desired concentration, and the volume particle size distribution is measured by a particle size distribution measuring apparatus ("SALD-2200" manufactured by Shimadzu Corporation). From the obtained particle size distribution, the average particle size of the inorganic filler after grinding can be obtained.

In the composition of the present invention, the inorganic filler (D-2) is used for the purpose of improving the thermal conductivity and controlling the coefficient of linear expansion. By the inorganic filler (D-2) having a volume average particle size different from the volume average particle size of the inorganic filler (D-1), voids among particles in the composition may mutually be filled with the inorganic filler (D-1), and remarkable effects to improve the thermal conductivity and to control the coefficient of linear expansion will be achieved. Use of the inorganic filler (D-2) contributes particularly to control of the coefficient of linear expansion.

The inorganic filler (D-2) of the present invention has a volume average particle size of more preferably at most 7 μm, further preferably at most 5 μm, particularly preferably at most 4 µm. On the other hand, with a view to obtaining favorable thermal conductivity and favorable flowability, the volume average particle size is preferably at least 0.1 µm, more preferably at least 0.3 µm, further preferably at least 0.5 µm.

In the present invention, the volume average particle size of the inorganic filler (D-1) and the volume average particle size of the inorganic filler (D-2) are different, and in order to achieve improvement of the thermal conductivity and control of the coefficient of linear expansion simultaneously, the difference in the volume average particle size is preferably at least 1 µm and at most 5 µm, more preferably at least 2 µm and at most 4 µm.

In the present invention, the ratio of the amount of the inorganic filler (D-1) to be used to the amount of the inorganic filler (D-2) to be used is not particularly limited, and the weight ratio of the inorganic filler (D-1) to the inorganic filler (D-2) is preferably such that the inorganic filler (D-1):the inorganic filler (D-2)=9:1 to 1:9, more preferably 8:2 to 2:8.

<Flux (E)>

The composition of the present invention preferably further contains a flux (E). The flux is, specifically, a compound which has flux functions to dissolve and remove the surface oxide film on metal electric signal terminals such as solder bumps and lands, improve the wettability on the land surface of the solder bumps and further, to prevent reoxidation on the metal terminal surface of the solder bumps, at the time of soldering of the metal terminals.

The flux to be used in the present invention may, for example, be an aliphatic carboxylic acid such as oxalic acid, malonic acid, succinic acid, glutaric acid, adipic acid, malic acid, tartaric acid, citric acid, lactic acid, acetic acid, propionic acid, butyric acid, oleic acid or stearic acid, an aromatic carboxylic acid or its acid anhydride, such as benzoic acid, salicylic acid, phthalic acid, trimellitic acid, trimellitic anhydride, trimesic acid or benzene tetracarboxylic acid, an organic carboxylic acid such as a terpene carboxylic acid such as abietic acid or rosin, or an organic carboxylate which is a hemiacetal ester having an organic carboxylic acid converted by reaction with an alkyl vinyl ether, an organic halogen compound such as glutamic acid hydrochloride, aniline hydrochloride, hydrazine hydrochloride, cetyl pyridine bromide, phenyl hydrazine hydrochloride, tetrachloronaphthalene, methyl hydrazine hydrochloride, methylamine hydrochloride, ethylamine hydrochloride, diethylamine hydrochloride or butylamine hydrochloride, an amine such as urea or diethylene triamine hydrazine, a polyhydric alcohol such as ethylene glycol, diethylene glycol, triethylene glycol, tetraethylene glycol or glycerin, an inorganic acid such as hydrochloric acid, hydrofluoric acid, phosphoric acid or fluoroboric acid, a fluoride such as potassium fluoride, sodium fluoride, ammonium fluoride, copper fluoride, nickel fluoride or zinc fluoride, a chloride such as potassium chloride, sodium chloride, cuprous chloride, nickel chloride, ammonium chloride, zinc chloride or stannous chloride, a bromide such as potassium bromide, sodium bromide, ammonium bromide, tin bromide or zinc bromide. These compounds may be used as they are or may be used in the form of microcapsules using a covering agent of e.g. an organic polymer or an inorganic compound. These compounds may be used alone or as a mixture of at least two in an optional combination and proportion.

In the composition of the present invention, the content of the flux (E) is preferably at least 0.1 part by weight and at most 10 parts by weight, more preferably at least 0.5 part by weight and at most 5 parts by weight per 100 parts by weight of all the epoxy compounds. If the content of the flux (E) is less than 0.1 part by weight per 100 parts by weight of all the epoxy compounds, solder connection failure may occur due to a decrease in the oxide film removability, and if it exceeds 10 parts by weight, connection failure may occur due to an increase in the viscosity of the composition.

The content of the flux (E) may be at least 5 parts by weight, and is preferably at least 10 parts by weight per 100 parts by weight of the total of all the epoxy compounds, all the curing agents and all the inorganic fillers. If it is lower than 5 parts by weight, the thermal conductivity of the obtainable resin composition tends to be low. On the other hand, the upper limit of the content may be 150 parts by weight, and is preferably 100 parts by weight. If the content is higher than 150 parts by weight, the viscosity of the composite material tends to be high, and the inorganic filler (D) is less likely to be uniformly dispersed.

The content of the flux (E) optionally contained in the composition of the present invention is not limited so long as the objects of the present invention are achieved, and to improve the storage stability of the composition of the present invention, the content of the flux (E) is preferably at least 0.1 part by weight and at most 6 parts by weight, more preferably at least 0.5 part by weight and at most 5 parts by weight, particularly preferably at least 0.5 part by weight and at most 3 parts by weight per 100 parts by weight of the total amount of the epoxy compound (A), the amine compound (B) and the amine compound (C).

<Dispersing Agent (F)>

In order to increase the dispersibility of the inorganic filler (D), the composition of the present invention may contain a dispersing agent, a surfactant, an emulsifier, a viscosity-lowering agent, a diluent, a defoaming agent, an ion trapping agent or the like. As a dispersing agent, it is preferred to use a dispersing agent having an amine value (mg-KOH/g) of at least 10 and at most 300, to increase the dispersity of the inorganic filler (D). Further, preferred is one having as a functional group a tertiary amino group, in view of excellent effects to improve the coating property of the liquid and to improve properties of the coating film. As an example of such a dispersing agent, an acrylic dispersing agent and/or a urethane dispersing agent may, for example, be mentioned.

As the surfactant, any one of known anionic surfactant, nonionic surfactant and cationic surfactant may be used.

For example, a polyoxyethylene alkyl ether, a polyoxyethylene alkyl aryl ether, a polyoxyethylene alkyl ester, a sorbitan alkyl ester, a monoglyceride alkyl ester, an alkyl benzene sulfonate, an alkylnaphthalene sulfonate, an alkyl sulfate, an alkyl sulfonate, a sulfosuccinate, an alkyl betaine or an amino acid may, for example, be mentioned.

Further, a fluorinated surfactant having some or all of C—H bonds in such a dispersing agent converted to C—F bonds may also be preferably used.

The amount of the surfactant to be used is preferably at a level of from 0.001 to 5 wt %, more preferably from 0.01 to 1 wt % based on the total solid content in the composition. If it is less than 0.001 wt %, dispersion properties of the inorganic filler (D) may not be improved in some cases, and if it exceeds 5 wt %, phase separation with the epoxy compound may occur in some cases, such being unfavorable.

The content of the dispersing agent (F) which is optionally contained in the composition of the present invention is not limited so long as the objects of the present invention are achieved, and in order to improve the flowability of the composition of the present invention, the content of the dispersing agent (F) is preferably at least 0.1 part by weight and at most 4 parts by weight, more preferably at least 0.1 part by weight and at most 2 parts by weight per 100 parts by weight of the inorganic filler (D) contained in the composition of the present invention.

<Compositional Ratio>

The contents of the respective components in the composition of the present invention are not limited so long as the objects of the present invention are achieved, and in order to increase the glass transition temperature of the composition of the present invention, in the first aspect of the present invention, the proportion of the amine compound (B) is preferably at least 51 parts by weight and at most 99 parts by weight, more preferably at least 51 parts by weight and at most 85 parts by weight, further preferably at least 55 parts by weight and at most 70 parts by weight, particularly preferably at least 61 parts by weight and at most 70 parts by weight per 100 parts by weight of the total amount of the amine compound (B) and the amine compound (C).

Further, in order to improve the K1c value of the composition of the present invention and to achieve a favorable balance between K1c and the glass transition temperature, the proportion of the amine compound (C) is preferably at most 49 parts by weight, more preferably at most 40 parts by weight, particularly preferably at most 35 parts by weight, and is preferably at least 1 part by weight, more preferably at least 15, particularly preferably at least 20 parts by weight, per 100 parts by weight of the total amount of the amine compound (B) and the amine compound (C).

The content of the inorganic filler (D) which is optionally contained in the composition of the present invention is not limited so long as the objects of the present invention are achieved, and in order to improve the K1c value of the composition of the present invention, the proportion of the inorganic filler (D) is preferably at least 10 parts by weight and at most 400 parts by weight, more preferably at least 20 parts by weight and at most 300 parts by weight, particularly preferably at least 20 parts by weight and at most 240 parts by weight per 100 parts by weight of the total amount of the epoxy compound (A), the amine compound (B) and the amine compound (C).

<Other Additives>

The composition of the present invention may contain various additives within a range not to impair the effects of the present invention, for the purpose of further improving the function.

Such additives may, for example, be a fine particle component to control alignment of the inorganic filler, a reactive diluent component to lower the viscosity of the composition without impairing properties of the epoxy resin, a resin component having a flexible skeleton or a rubber elastic skeleton to improve film physical properties such as the elastic modulus and the fracture toughness, rubber-like particles of from about 0.01 to about 1 µm, and an ion scavenger to scavenge ion components such as alkali metal ions or halogen ions.

As the fine particle component to control alignment of the inorganic filler, it is preferred to use one having a volume average particle size of at least 0.5 µm and at most 20 µm, more preferably at least 1 µm and at most 10 µm. As such a fine particle component, fine particles of a resin may, for example, be fine particles comprising as a base a resin obtainable from a methacrylate such as methyl methacrylate or butyl methacrylate or an acrylate, copolymer particles of the above monomer with another monomer such as methyl vinyl ether, vinyl acetate or divinyl benzene, or acrylic fine particles such as fine particles obtained by crosslinking them; styrene type fine particles; polyethylene type fine particles such as low density polyethylene fine particles, high density polyethylene fine particles, ultrahigh molecular weight polyethylene fine particles or ethylene/acrylic copolymer fine particles; nylon type fine particles, PAN type fine particles containing polyacrylonitrile as the main component; thermosetting or thermoplastic polyurethane type fine particles; phenol resin type fine particles such as novolac resin fine particles or resol resin fine particles; silicone resin type fine particles such as silicone resin fine particles or silicone resin-covered fine particles; benzoguanamine/melamine type fine particles such as benzoguanamine/formaldehyde condensed fine particles, benzoguanamine/melamine/formaldehyde condensed fine particles or melamine/formaldehyde condensed fine particles; fluororesin type fine particles such as tetrafluoroethylene resin fine particles; engineering plastic type fine particles such as aramid fine particles, polyimide fine particles or PEEK fine particles; or natural polymer type fine particles such as silk. Further, as inorganic fine particles, preferred are insulating fine particles, and for example, fine particles of an inorganic acid such as aluminum oxide (alumina), silicon oxide (silica), magnesium oxide, beryllium oxide, zinc oxide, calcium oxide or zirconium oxide; an inorganic nitride such as aluminum nitride or silicon nitride; an inorganic carbide such as silicon carbide, titanium carbide or boron carbide; or diamond; may, for example, be mentioned. Among them, preferred is silicon oxide (silica) or aluminum oxide (alumina). Such fine particles may be used alone or as a mixture of at least two in an optional combination and proportion.

The reactive diluent is preferably one having at least two epoxy groups in its molecule, and with a view to reducing the melt viscosity, its epoxy equivalent is preferably at least 70 g/equivalent and at most 350 g/equivalent, more preferably at least 80 g/equivalent and at most 200 g/equivalent. Such a reactive diluent may, for example, be a glycidyl ether of a dihydric or higher polyhydric alcohol, such as 1,4-butanediol diglycidyl ether, 1,6-hexanediol diglycidyl ether, 1,4-cyclohexanediol diglycidyl ether, 1,4-cyclohexane dimethanol diglycidyl ether, glycerol diglycidyl ether, glycerol triglycidyl ether or erythritol tetraglycidyl ether.

Further, as the resin component, a resin having a flexible or rubber elastic skeleton is preferred, and particularly, an epoxy resin having a flexible or rubber elastic skeleton is preferred.

Further, as the rubber-like particles, considering applicability to a process for producing a layered semiconductor device as an interlayer filler, preferred are rubber-like particles having a particle size of from 0.01 to 1 µm. To promote dispersion of the rubber-like particles into the resin, the particle surface may be covered with a resin component different from the rubber-like component. The rubber-like component may be a general purpose rubber component. Among them, preferred is a rubber component such as styrene butadiene rubber, polybutadiene rubber or silicon rubber.

In addition, a coupling agent such as a silane coupling agent or a titanate coupling agent as an additive component to improve the bonding property to a substrate or the bonding property between the resin and the inorganic filler, an ultraviolet inhibitor to improve the storage stability, an antioxidant, a plasticizer, a flame retardant, a coloring agent, a thermoplastic oligomer with a view to improving the flowability at the time of forming and improving the adhesion to a substrate, may be added. Each of these additives may be used alone or as a mixture of at least two in optional combination and proportion. The amount of such additives is not particularly limited, and they are used in amounts for a conventional resin composition to such an extent that necessary functions are obtained.

In the composition of the present invention, it is preferred to use, as the epoxy compound, amine compound, inorganic filler, flux, dispersing agent and other additives as constituting components, ones which have been preliminarily purified, so as to reduce elution of ion components from the cured film and to improve the reliability of a layered semiconductor device. Further, it is preferred to use an ion scavenger having a function to scavenge ion components, so as to reduce elution of ion components from the cured film and to improve the reliability of a layered semiconductor device when the composition is used as an interlayer filler material of the layered semiconductor device. As an ion scavenger, one which scavenges alkali metal ions such as sodium ions or potassium ions may preferably be used, and use of a scavenger excellent in scavenging of halogen ions such as chlorine or bromine is more preferred. Such an ion scavenger is preferably an inorganic ion exchanger containing bismuth, aluminum, magnesium or the like.

Further, if the composition of the present invention contains hydrolysable chlorine, the reliability of the obtainable layered semiconductor device may be decreased, and accordingly the amount of hydrolysable chlorine in the composition is preferably at most 150 ppm, more preferably at most 100 ppm, further preferably at most 50 ppm, particularly preferably at most 20 ppm. In order that the amount of hydrolysable chlorine is within a preferred range, a method may be employed in which hydrolysable chlorine in the epoxy compound (A) may be reduced by extraction with a solvent such as water, followed by separation, or purification by distillation. For example, with respect to a diglycidyl ether modified product of 2,2-bis(4-hydroxyphenyl)propane, purification is possible by distillation under reduced pressure of at most 100 Torr at a temperature of from 160 to 200° C., and with respect to 1,4-cyclohexanedimethanol diglycidyl ether modified product, purification is possible by a method in which pure water is added, followed by stirring and mixing, and the mixture is left at rest for phase separation, followed by liquid separation and dehydration.

<Process for Producing Composition>

The composition suitable for an interlayer filler of a layered semiconductor device of the present invention can be prepared by mixing the constituents in the above mixing ratio. On that occasion, for the purpose of improving the uniformity of the composition, defoaming, etc., mixing is carried out preferably by using e.g. a paint shaker or a bead mill, a planetary mixer, a stirring type dispersing machine, a rotary and revolutionary stirring mixing machine or a three-roll mill. Further, the order of mixing the respective components is optional so long as there are no problem such that the reaction occurs or the precipitates form. Any two or more components are preliminarily mixed among the constituents for the composition and then the other components are mixed, or all the components are mixed all at once.

When the constituents for the composition of the present invention are mixed, mixing is carried out preferably with heating to ordinary temperature or higher so that he respective constituents are more uniformly mixed. Mixing is carried out at a temperature of more preferably at least 40° C. and at most 130° C. If mixing is carried out at a temperature of 40° C. or below, due to a high viscosity of the epoxy compound (A), the inorganic filler (D) is hardly dispersed uniformly when mixed, and if mixing is carried out at a temperature of 130° C. or higher, bubbles are likely to be included in the composition.

Further, inclusion of bubbles when the constituents for the composition of the present invention are mixed may be reduced by lowering the pressure at the time of mixing. More specifically, the pressure in the mixing tank is preferably at most 100 Torr, more preferably at most 90 Torr, particularly preferably at most 80 Torr.

Further, in order for uniform mixing, an organic solvent or a liquid resin may be used in combination. The organic solvent to be used for the composition of the present invention, a ketone such as acetone, methyl ethyl ketone (MEK), methyl isobutyl ketone, methyl amyl ketone or cyclohexanone, an ester such as ethyl acetate, an ether such as ethylene glycol monomethyl ether, an amide such as N,N-dimethylformamide or N,N-dimethylacetamide, an alcohol such as methanol or ethanol, an alkane such as hexane or cyclohexane, or an aromatic compound such as toluene or xylene.

Considering the solubility of the resin, the boiling point of the solvent, etc., preferred is a ketone such as methyl ethyl ketone or cyclohexanone, an ester or an ether, and particularly preferred is a ketone such as methyl ethyl ketone or cyclohexanone.

Such organic solvents may be used alone or as a mixture of at least two in an optional combination and proportion.

In the composition of the present invention, the proportion of the organic solvent to the other components is not particularly limited, and it is preferred to use the organic solvent in a proportion such that the solid content concentration in the composition is at least 20 wt % and at most 70 wt %, particularly at least 30 wt % and at most 60 wt %. By using the organic solvent in such a proportion, it is possible to form a favorable coating film using the composition of the present invention by an optional coating method.

If the mixing ratio of the organic solvent is less than the above lower limit, the viscosity of the composition increases, and a favorable interlayer may not be obtained in some cases, and if it exceeds the above upper limit, no desired film thickness of the interlayer may be obtained. The solvent may be removed by vacuum drying after mixing.

The composition suitable as the interlayer filler for a layered semiconductor device of the present invention may further be heated and formed to obtain a formed product. The forming may properly be carried out using a conventional method depending upon the state of the composition and the type of the resin.

For example, forming of a composition having plasticity and flowability may be carried out by curing the composition in a desired shape, for example, in a state where put in a mold. For production of such a formed product, injection molding, injection compression molding, extrusion or compression molding may be employed. Further, forming of the formed product i.e. curing may be carried out at the curing temperature of each composition. Further, the formed product may be obtained also by carving a cured product of the interlayer filler composition into a desired shape.

The composition of the present invention has high thermal conductivity and is thereby useful as a heat dissipating substrate, a heat dissipating sheet, a thermally conductive paste, a thermally conductive adhesive, a semiconductor package, a heatsink, a heat pipe, a chassis of an electric and electronic equipment, required to have thermal conductivity in the electric and electronic field. It is particularly useful as an interlayer filler of a layered semiconductor device.

<Layered Semiconductor Device>

The layered semiconductor device of the present invention is one having a plurality of substrates, and the substrates may be an organic substrate represented by an organic interposer, or a silicon substrate having a semiconductor device layer such as a memory circuit or a logic circuit formed thereon, and the layered semiconductor device of the present invention has an interlayer filler layer containing the composition of the present invention between optional substrates selected from such substrates.

By the properties of the composition of the present invention such that the composition has a low melt viscosity even when the inorganic filler (D) is blended in a high proportion, and a high coefficient of thermal conductivity, a high K1c value and a high glass transition temperature are satisfied simultaneously, the composition of the present invention is applicable to a process of laminating substrates and to a layered semiconductor device, and an interlayer filler layer can be formed such that electrical bonding of a layered semiconductor device is stably maintained even regardless of various changes of environment.

Substrate

The substrate in the layered semiconductor device of the present invention may be more specifically an organic substrate of e.g. an epoxy resin or a polyimide resin, or a semiconductor substrate having a wire circuit, a through-silicon via (TSV) or a semiconductor device circuit formed thereon. The layer formed by curing the composition of the present invention may be provided between an organic substrate and a semiconductor substrate, between semiconductor substrates or between organic substrates. By using the interlayer filler composition of the present invention, even in the case of a layered semiconductor device comprising an organic substrate and a semiconductor substrate, as compared with a conventional case where a space between layers is filled with an underfill after reflow, bonding with a small resistance between terminals is achieved by suppressing warpage of substrates in bonding of a thin semiconductor substrate or a large semiconductor substrate and by suppressing formation of voids even in a large bonding area. Further, a semiconductor substrate, as compared with an organic substrate, has a high smoothness on the substrate surface, is capable of e.g. circuit transfer by finer lithography, and formation of smaller connection terminals such as copper posts and solder bumps on the semiconductor substrate is possible, and by formation of connection terminals with a narrow space between the terminals, it is possible to realize a high performance layered semiconductor device having a high wiring density.

Semiconductor Substrate

As the semiconductor substrate in the present invention, a substrate made of an optional material which may be used as a substrate in production of an integrated circuit may be used, and a silicon substrate is preferably used. The silicon substrate may be used as a substrate having a thickness depending upon the aperture, or may be used after formed into a thin film of at most 100 μm by back polishing such as backside etching or back grinding.

The semiconductor substrate in the present invention may be a semiconductor substrate having a wire circuit formed thereon, a semiconductor substrate having a through-silicon via (TSV) formed thereon or a semiconductor substrate having a semiconductor device circuit such as a transistor formed thereon, and may be a substrate of e.g. silicon, germanium, germanium silicide, silicon carbide, gallium arsenide, gallium phosphide, gallium nitride or the like, as the case requires doped with phosphorus or boron by ion implantation, more specifically a N type silicon substrate or a P type silicon substrate.

The semiconductor device circuit formed on the surface of the semiconductor substrate may be an arithmetic element such as DSP or MPU, and a storage element such as a non-volatile memory or a dynamic random access memory. The coefficient of linear expansion of a semiconductor substrate varies depending upon its material and is usually from 1 to 10 ppm/K.

The semiconductor substrate usually has solder bumps and land terminals. As solder bumps, fine solder balls may be used, or solder bumps may be formed in such a manner that openings are formed by lithography, and solder is applied directly to the underlayer of the openings or to posts of nickel or copper formed on the openings, and the resist material is removed, followed by heat treatment. The composition of the solder is not particularly limited, and considering electric bonding property and low temperature bonding property, solder containing tin as a main component is preferably used.

The land terminals may be formed in such a manner that a thin film is formed on the semiconductor substrate e.g. by (PVD) physical vapor deposition, a resist film is formed by lithography, and unnecessary portions are removed by dry or wet etching. The material of the land terminals is not particularly limited so long as it can be bonded to the solder bumps, and considering the bonding property to the solder, the reliability, etc., gold or copper may preferably be used.

Organic Substrate

The organic substrate is one having an electrically conductive wire circuit, and more specifically, one obtained by forming a thermosetting resin such as an epoxy resin or a polyimide resin into a plate with e.g. glass fibers sandwiched therebetween. The organic substrate is a pattern conversion substrate (interposer) for high density packaging to connect the semiconductor substrate to array-form electrodes employing solder balls as external electrodes, and e.g. an epoxy resin is preferably used as the resin components constituting the organic substrate, and copper (Cu) is preferably used as the wiring layer. On the surface of the organic substrate, terminals for connection are provided, and they are usually formed by a combination of photolithography and a plating method or by a printing method, and usually the distance between the terminals is from 50 μm to 300 μm. The coefficient of linear expansion of the organic substrate varies depending upon the material, and is usually from 5 to 50 ppm/K in the case of the organic interposer substrate. The semiconductor substrate laminate placed on a printed substrate is connected to the organic substrate via e.g. solder bumps, and the organic substrate may be electrically connected to the terminals of the printed substrate via the array-form electrodes.

Lamination

The interlayer filler layer containing the composition of the present invention is formed between optional substrates selected from an organic substrate and a semiconductor substrate, and in order that characteristics such as a low melt viscosity, a high coefficient of thermal conductivity, a high K1c value and a high glass transition temperature, the interlayer filler layer is preferably formed to be in contact with the semiconductor substrate, and particularly preferably the interlayer filler layer containing the composition of the present invention is formed between semiconductor substrates.

<Process for Producing Layered Semiconductor Device>

The layered semiconductor device of the present invention may be produced by a production process which comprises a step of forming an interlayer filler layer containing the composition of the present invention on the surface of a semiconductor substrate by a pre-application method, pressure-bonding the semiconductor substrate with another substrate, and treating the laminate at a temperature of at least 120° C. and at most 180° C.

Formation of Interlayer Filler Layer by Pre-Application Method

For formation of the interlayer filler layer by a pre-application method, a conventional forming method, more specifically for example, a dipping method, a spin coating method, a spray coating method, a blade method or another optional method may be employed. The interlayer filler layer may be formed on either surface of the semiconductor substrate, and is preferably formed on a surface having solder bumps or a surface having lands.

Pressure Bonding

The interlayer filler layer obtained from the composition of the present invention is preferably subjected to a baking treatment at an optional temperature of from 50 to 150° C., preferably at an optional temperature of from 60 to 130° C., for B-stage formation, so as to remove low molecular weight components, etc. contained in the composition.

On that occasion, the baking treatment may be carried out at a certain temperature, or the baking treatment may be carried out under reduced pressure in order that removal of volatile components in the composition smoothly proceeds. Further, within a range where curing of the resin will not proceed, baking treatment by stepwise heat increase may be carried out. For example, baking treatment may be carried out initially at 60° C., then at 80° C. and further at 120° C. each for from about 5 to about 90 minutes.

After the interlayer filler layer is formed, the substrate having the interlayer filler layer formed thereon is subjected to temporary bonding with a substrate to be bonded. The temporary bonding temperature is preferably from 80° C. to 150° C. In a case where a plurality of semiconductor substrates are to be bonded, temporary bonding may be repeatedly carried out for the respective substrates, or a plurality of substrates may be overlaid, and they are temporarily bonded by heating altogether. For the temporary bonding, as the case requires, a load of from 1 gf/cm$^2$ to 50 Kgf/cm$^2$, preferably from 10 gf/cm$^2$ to 10 Kgf/cm$^2$ is applied to the substrates.

After the temporary bonding, main bonding is carried out. The temporarily bonded semiconductor substrates are pressure-bonded at a temperature of at least 200° C., preferably at least 220° C., whereby the melt viscosity of the composition contained in the interlayer filler composition is lowered to accelerate connection of electric terminals between the substrates and at the same time, solder bonding between the semiconductor substrates is realized. The upper limit of the heating temperature is properly determined so long as the epoxy compound to be used is not decomposed or denatured, and is usually at most 300° C.

Further, at the time of pressure bonding, as the case requires, a load of preferably from 10 gf/cm$^2$ to 10 Kgf/cm$^2$, more preferably from 50 gf/cm$^2$ to 5 Kgf/cm$^2$ is applied to the substrates.

EXAMPLES

Now, the present invention will be described in further detail with reference to Examples. However, it should be understood that the present invention is by no means restricted to the following Examples within the scope of the present invention.

Examples A-1 to A-5 and Comparative Examples A-6 to A-12

Component Blended

Components blended for the interlayer filler composition coating liquid are as follows.
<Epoxy Compounds>
Epoxy compound (A-5): "LX-01" manufactured by DAISO CHEMICAL CO., LTD. (bisphenol A type glycidyl ether epoxy resin, epoxy equivalent: 181 g/equivalent, viscosity at 25° C.: 1×10$^{-1}$ Pa·s)
<Amine Compound (B)>
Amine compound (B1): "Seikacure-S" manufactured by Wakayama Seika Kogyo Co., Ltd. (4,4'-diaminodiphenylsulfone, amine value: 124 g/equivalent, melting point: 177° C.)
Amine compound (B2): "CUA-4" manufactured by Ihara Chemical Industry Co., Ltd. (trimethyleneoxybis-4-aminobenzoate, amine value: 157 g/equivalent, melting point: 122 to 128° C.)
<Amine Compound (C)>
Amine compound (C1): "ELASMER 250P" manufactured by Ihara Chemical Industry Co., Ltd. (polytetramethyleneoxybis-4-aminobenzoate, amine value: 235 g/equivalent, melting point: 60° C., viscosity at 25° C.: 1×10$^2$ Pa·s)
Amine compound (C2): "KAYAHARD AA" manufactured by Nippon Kayaku Co., Ltd. (a mixture of a polycondensate of formaldehyde-2-ethylaniline and 3,3'-diethyl-4,4'-diaminodiphenylmethane (melting point: 46° C.), amine value: 126 g/equivalent, liquid at room temperature)
<Inorganic Filler (D)>
Inorganic filler (2): "MUF-2BV" manufactured by Tatsumori Ltd. (silica filler) Inorganic filler (8): boron nitride "R—BN" manufactured by NISSIN REFRATECH CO., LTD.
<Flux (E)>
Adipic acid manufactured by Wako Pure Chemical Industries Ltd., special grade reagent
<Dispersing Agent (F)>
"BYK-2155" manufactured by BYK Japan K.K., amine value: 48 mg-KOH/g
[Evaluation of Physical Properties and Characteristics]
(1) Melt Viscosity of Epoxy Compound
The melt viscosity (cone-plate shear viscosity) was measured using a viscoelasticity measuring apparatus Physica MCR102 manufactured by Anton Paar Japan K.K.
The epoxy compound to be measured was placed between a parallel plate dish and a cone plate (25 mm in diameter, α=1.984°) and the cone plate shear viscosity was measured.
(2) Particle Size of Boron Nitride Filler and Inorganic Filler
The interlayer filler composition coating liquid after stirring and mixing was dispersed in cyclohexanone, and the particle size was measured by a particle size distribution measuring apparatus "SALD-2200" manufactured by Shimadzu Corporation. From the obtained particle size distribution, the volume average particle size and the maximum particle size of the inorganic filler after grinding were obtained.
(3) Specific Surface Area of Inorganic Filler
The inorganic filler was pre-treated in a nitrogen gas flow at 250° C. for 15 minutes, and then the specific surface area was measured by a BET one point method (adsorption gas: nitrogen) using Macsorb HM-MODEL-1201 manufactured by MOUNTECH Co., Ltd.

(4) Evaluation of Fracture Toughness (Hereinafter Sometimes Referred to Simply as K1c)

The fracture toughness was evaluated in accordance with ASTM E-399. Using MST-I load cell 100N manufactured by Shimadzu Corporation, 3-point loading test was carried out at a rate of 0.5 mm/min, and the fracture toughness was calculated from the maximum load at the point of breakage. The higher the fracture toughness, the higher the bond strength of a semiconductor device and the more preferred, and a case where the calculated fracture toughness was 1.0 (MPa·√m) or higher, was judged as a sufficient strength for use for a layered semiconductor device.

(5) Measurement of Glass Transition Temperature (Hereinafter Sometimes Referred to Simply as Tg)

Using a viscoelasticity measuring apparatus Physica MCR102 manufactured by Anton Paar Japan K.K., the prepared composition was sandwiched between an aluminum disposable dish and a parallel plate (diameter: 20 mm), and the dynamic viscoelasticity was measured. A temperature at which the loss elastic modulus of a cured product was maximum within a range of from 30 to 200° C. was taken as the glass transition point. The measurement conditions were such that the composition was thermally cured at 150° C. for 2 hours on the dish under conditions of y=0.5% and w=1 Hz and then cooled to room temperature, and heated from 30° C. to 200° C. at a rate of 3° C./min. The higher the glass transition temperature, the more excellent the heat resistance, and the glass transition temperature is required to be at least the operating temperature of the semiconductor device.

(6) Evaluation of Flowability

A prepared composition heated to 80° C. which ran out of a container when the container was tilted was evaluated as having favorable flowability and described as "○", and a composition which did not run out of the container was evaluated as having poor flowability and described as "x" in Table 1.

(7) Evaluation of Bonding Property

Using a Flip Chip Bonder FC3000S manufactured by Toray Engineering Co. Ltd., a sample was prepared by a pre-application method of filling a prepared composition simultaneously with flip chip mounting, and the electric resistance of the formed electronic circuit was evaluated by 4-point probes method. Where the resistance after flip chip mounting was R1 and the resistance after the composition was thermally cured at 150° C. for 2 hours was R2, a case where (R2−R1)/R1 was within ±3% was evaluated as that favorable bonding was possible and described as "○" in Table 1.

Example A-1

In a 125 cc stirring container, 7.1 g of epoxy compound (A-5) was weighed, 2 parts by weight (0.47 g) of dispersing agent (F) was blended relative to the amount of all the fillers added, and the mixture was stirred for one minute by a rotary and revolutionary stirring machine (ARV-310) manufactured by THINKY CORPORATION at 2,000 rpm under 1 kPa. To the resulting mixture, 2.3 g of amine compound (B1) and 0.6 g of amine compound (C1) were added, followed by stirring by the rotary and revolutionary stirring machine at 2,000 rpm under 1 kPa for 2 minutes, and then 23.3 g of inorganic filler (2) was added, followed by stirring by the rotary and revolutionary stirring machine under a pressure of 1 kPa at 2,000 rpm for 5 minutes. Further, flux (E) was added in an amount of 4 parts by weight (0.4 g) based on the total weight of the epoxy compound used and the amine compounds used, followed by stirring under a pressure of 1 kPa at 2,000 rpm for 5 minutes to obtain a composition. The composition was cast into a mold of 50 mm×30 mm×3 mm in thickness and thermally cured at 150° C. for 2 hours to obtain a cured product. The cured product was cut into a size of 4.4 mm×21.6 mm×2.2 mm to obtain a sample for measurement of fracture toughness. The results of evaluation of the fracture toughness, the results of measurement of the glass transition temperature and the results of evaluation of flowability are shown in Table 1.

Examples A-2 to A-5 and Comparative Examples A-6 to A-12

In the same manner as in Example 1, epoxy compound (A-5), amine compound (B-1), amine compound (B2), amine compound (B3), amine compound (C1), inorganic filler (2) and inorganic filler (8) were blended as identified in Table 1. In all the Examples and Comparative Examples, the amounts of the flux (E) and the dispersing agent (F) were the same as in Example 1, whereby a composition was obtained.

The results of evaluation of fracture toughness, the results of measurement of the glass transition temperature and the results of evaluation of flowability are shown in Table 1.

TABLE 1

Blend ratio of composition and evaluation results

| | No. | Composition | | | | | | | Evaluation results | | | |
|---|---|---|---|---|---|---|---|---|---|---|---|---|
| | | Epoxy compound (A-5) | Amine compound (B1) | Amine compound (B2) | Amine compound (C1) | Amine compound (C2) | Inorganic filler (2) | Inorganic filler (8) | K1c (MPa·√m) | Tg (° C.) | Flowability | Bonding |
| Examples | A-1 | 71 | 23 | — | 6 | — | 233 | — | 2.6 | 135 | ○ | — |
| | A-2 | 69 | 19 | — | 12 | — | 233 | — | 2.5 | 122 | ○ | ○ |
| | A-3 | 67 | — | 27 | 6 | — | 233 | — | 2.8 | 122 | ○ | — |
| | A-4 | 66 | — | 23 | 11 | — | 233 | — | 3.0 | 116 | ○ | — |
| | A-5 | 69 | 19 | — | 12 | — | 200 | 33 | 2.2 | 122 | ○ | — |
| Comparative Examples | A-6 | 67 | 15 | — | 17 | — | 233 | — | 2.7 | 111 | ○ | — |
| | A-7 | 66 | 12 | — | 22 | — | 233 | — | 3.1 | 80 | ○ | — |
| | A-8 | 64 | — | 15 | 22 | — | 233 | — | 3.2 | 100 | ○ | — |
| | A-9 | 65 | — | 19 | 17 | — | 233 | — | 3.2 | 113 | ○ | — |
| | A-10 | 60 | — | — | 40 | — | 233 | — | 2.6 | 71 | ○ | — |
| | A-11 | 73 | — | — | — | 27 | 170 | — | 0.9 | — | ○ | — |
| | A-12 | 74 | 26 | — | — | — | 233 | — | — | — | x | — |

In the above Table, "—" represents that the material was not used or the evaluation was not carried out.

From the above results, the composition of the present invention has excellent heat resistance due to a high glass transition temperature, and is capable of forming an interlayer filler layer having high toughness suitable to maintain stable bonding without cracks or separation even by various changes of environment, and further, it is capable of secure electric bonding of substrates, and a favorable layered semiconductor device can be produced using the composition.

Examples B-1 to B-13 and Comparative Examples B-1 to B-3

Component Blended

<Epoxy Compound>
Epoxy compound (A-1): "YL6810" manufactured by Mitsubishi Chemical Corporation (epoxy equivalent: 171 g/equivalent)
Epoxy compound (A-5): "LX-01" manufactured by DAISO CHEMICAL CO., LTD. (epoxy equivalent: 189 g/equivalent)
Epoxy compound (A-6): "1006FS" manufactured by Mitsubishi Chemical Corporation (epoxy equivalent: 950 g/equivalent)
<Inorganic Filler (D-1)>
Inorganic filler (1): silica "PLV-4" manufactured by Tatsumori Ltd.
Inorganic filler (2): silica "MUF-2BV" manufactured by Tatsumori Ltd.
<Inorganic Filler (D-2)>
Inorganic filler (3): aluminum nitride "AlN—H" manufactured by Tokuyama Corporation
Inorganic filler (6): alumina "AA-3" manufactured by Suminoto Chemical Company, Limited
Inorganic filler (7): magnesium oxide "HP-30A" manufactured by Konoshima Chemical Co., Ltd.
Inorganic filler (8): boron nitride "R—BN" manufactured by NISSIN REFRATECH CO., LTD.
Inorganic filler (9): alumina "AE-2054SXM" manufactured by Admatechs Company Limited
<Curing Agent>
Curing agent (1): 1-cyanoethyl-2-undecylimidazole "C11Z—CN" manufactured by SHIKOKU CHEMICALS CORPORATION
Curing agent (2): polytetramethyleneoxybis-4-aminobenzoate "ELASMER 250P" manufactured by Ihara Chemical Industry Co., Ltd.
Curing agent (3): 4,4'-diaminodiphenylsulfone "Seikacure-S" manufactured by Wakayama Seika Kogyo Co., Ltd.
<Flux (E)>
Adipic acid manufactured by Wako Pure Chemical Industries Ltd., special grade reagent
<Dispersing Agent (F)>
"BYK-2155" manufactured by BYK Japan K.K., amine value: 48 mg-KOH/g
[Evaluation of Physical Properties and Characteristics]
(1) Melt Viscosity of Epoxy Compound
The melt viscosity (parallel plate dynamic viscosity) was measured using a viscoelasticity measuring apparatus Physica MCR102 manufactured by Anton Paar Japan K.K.
First, the epoxy compound (in a case where a plurality of epoxy compounds are used, their composition) to be measured was placed between a parallel plate dish and a parallel plate (20 mm in diameter), and the parallel plate dynamic viscosity was measured.

As the measurement conditions, 0.5% of sine wave distortion was applied to the sample, the angular frequency of the distortion was 10 rad/sec, and the viscosity in a step of raising the temperature at a rate of 3° C. per minute was measured at from 40° C. to 200° C.
(2) Particle Size of Silica Filler and Inorganic Filler
The composition after components were stirred and mixed was dispersed in cyclohexanone, and the particle size was measured by a particle size distribution measuring apparatus "SALD-2200" manufactured by Shimadzu Corporation. From the obtained particle size distribution, the volume average particle size and the maximum particle size of the inorganic filler after grinding were obtained.
(3) Specific Surface Area of Inorganic Filler
The inorganic filler was pre-treated in a nitrogen gas flow at 250° C. for 15 minutes, and the specific surface area was measured by a BET one point method (adsorption gas: nitrogen) using Macsorb HM MODEL-1201 manufactured by Mountech Co., Ltd.
(4) Evaluation of Cracking
0.1 g of the composition was applied to a 10 mm square silicon substrate (thickness: 500 μm) and cured on a hotplate at 150° C. or 165° C. for 2 hours, and after the curing treatment, it was cooled to room temperature. On that occasion, cracking was visually confirmed, and a case where cracking formed on the curing layer or the silicon substrate was evaluated as inappropriate for use as an interlayer material of a layered semiconductor device and described as "x", and a case where the composition was not changed was evaluated as suitable for use as an interlayer material of a layered semiconductor device and described as "○" in Table 4.
(5) Coefficient of Thermal Conductivity of Cured Layer
With respect to the cured layer of the composition, using the following apparatus, the heat diffusivity, the specific gravity and the specific heat were measured, and these measured values were multiplied to determine the coefficient of thermal conductivity.
1) Thermal diffusivity: "ai-Phase Mobile 1μ" manufactured by ai-Phase Co., Ltd.
2) Specific gravity: "Balance XS-204" (using solid specific gravity measuring kit) manufactured by Mettler-toredo International Inc.
3) Specific heat: "DSC320/6200" manufactured by Seiko Instruments Inc.
(6) Evaluation of Fracture Toughness
The fracture toughness was evaluated in the same manner as (4) evaluation of fracture toughness in the above series of Examples A.
(7) Measurement of Glass Transition Temperature
The cured layer of the composition was cut into a size of 20 mm×3 mm, and the amount of change from −50° C. to 290° C. at a temperature-raising rate of 10° C./min was measured by a tensile method under a load of 5 gf in a nitrogen atmosphere using a thermomechanical analyzer TMA4000SA manufactured by Bruker. The intersection point of an extrapolation line at a point where the gradient of the line significantly changes was taken as the glass transition point, and the temperature at the glass transition point was taken as the glass transition temperature. The higher the glass transition temperature, the more excellent the heat resistance and the better, and the glass transition temperature should be at least the operating temperature of a semiconductor device.
(8) Coefficient of Linear Expansion
In measurement of the glass transition temperature, the degree of elongation (ppm) of the cured layer per 1° C. (1

K) from −10° C. to 40° C. was calculated and taken as the coefficient of linear expansion (ppm/K). The composition of the present invention is suitably used for between substrates of a layered semiconductor device, and in such a case, in relation to the coefficient of linear expansion of the substrate of the semiconductor device, the coefficient of linear expansion of the cured layer is suitably from 20 ppm/K to 33 ppm/K.

(9) Evaluation of Bonding Property

About 25 μL of the prepared composition was applied while the solder bump substrate made of silicon (CC80 Model I) manufactured by WALTS was heated at 80° C. The solder bump substrate and an interposer (IP80 Model I) manufactured by WALTS, were bonded by heat pressing by heating up to 250° C. using a Flip Chip Bonder (FC3000S) manufactured by Toray Engineering Co. Ltd., cooled and then cured at 150° C. for 2 hours to form a laminate. The electric resistance of a daisy chain in the interior of the laminate was measured by a digital multimeter, and a case with an electric resistance of at most 30Ω was evaluated as passed with electrical bonding achieved, and described as "∘" in Table 4.

(10) Evaluation of Void in Bonded Surface

With respect to a chip having a solder bump substrate made of silicon bonded to an organic interposer substrate via the composition, presence or absence of a void in between bumps in the bonded chip was evaluated using an ultrasonic imaging device (HYE-FOCUS II) manufactured by Hitachi Kenki FineTech Co., Ltd. The interlayer material of a layered semiconductor preferably has less void, particularly preferably no void.

Examples B-1 to B-4

In a 125 ml stirring container, epoxy compound (A-1) was weighed, and dispersing agent (F) was added thereto, followed by stirring by a rotary and revolutionary stirring machine (ARV-310 manufactured by THINKY Corporation) at 2,000 rpm for 5 minutes. To the mixture, inorganic filler (1), inorganic filler (6) and inorganic filler (8) were added in amounts as identified in Table 4, followed by stirring by the rotary and revolutionary stirring machine at 2,000 rpm for 5 minutes. Further, curing agent (1) was added in an amount of 6 wt % based on the total amount of the resin and flux (E) was added in an amount of 2 wt % based on the total amount of the resin, followed by stirring by the rotary and revolutionary stirring machine at 2,000 rpm under 1.2 kPa for 5 minutes under vacuum degassing to obtain compositions in Examples B-1 to B-4. Physical properties of the epoxy compound used are shown in Table 2, and the volume average particle size and the specific surface area of the fillers are shown in Table 3.

Each composition was applied to a release film placed on a glass substrate, and on the coating layer, a release film and a glass substrate were further placed via spacers to sandwich the coating layer, followed by pressing (pressure: 1 MPa) at 150° C. for 2 hours to form and cure the composition thereby to prepare a layer having a film thickness of 500 μm. The coefficient of linear expansion and the coefficient of thermal conductivity of the prepared layer are shown in Table 4.

0.1 g of the composition in Example B-2 was applied to a 10 mm square silicon substrate (film thickness: 500 μm) at 80° C. and cured on a hotplate at 150° C. for 2 hours. After completion of the curing reaction, the silicon substrate was cooled to room temperature, whereupon cracking did not occur on the layer made of the composition and the silicon substrate.

Using the compositions in Examples B-2 and B-4, about 25 μL of the composition was applied with heating to 80° C. to a solder bump substrate (CC80 Model I) made of silicon manufactured by WALTS. The solder bump substrate and an interposer (IP80 Model I) manufactured by WALTS were bonded by heat pressing by heating up to 250° C. using a Flip Chip Bonder (FC3000S) manufactured by Toray Engineering Co. Ltd., cooled and then cured at 150° C. for 2 hours to form a laminate. The electric resistance of a daisy chain in the interior of the laminate was measured by a digital multimeter, whereupon either sample had an electric resistance of at most 30Ω.

With respect to such a laminate, presence or absence of a void in between bumps in the bonded chip was evaluated using an ultrasonic imaging device (HYE-FOCUS II) manufactured by Hitachi Kenki FineTech Co., Ltd., whereupon either sample had no void.

Examples B-5 to B-13

In a 125 ml stirring container, epoxy compound (A-5) was weighed as identified in Table 4, and curing agents (2) and (3) were added, and dispersing agent (F) was further added, followed by stirring by a rotary and revolutionary stirring machine (ARV-310 manufactured by THINKY Corporation) at 2,000 rpm for 5 minutes. To the mixture, inorganic filler (1) or (2) and inorganic filler (3), (6), (7), (8) or (9) were added in amounts as identified in Table 4, followed by stirring by the rotary and revolutionary stirring machine at 2,000 rpm for 5 minutes. Further, flux (E) was added in an amount of 1 wt % based on the total amount of the resin, followed by stirring by the rotary and revolutionary stirring machine at 2,000 rpm under 1.2 kPa for 5 minutes under vacuum degassing, to obtain compositions in Examples B-5 to 13. Physical properties of the epoxy compound used are shown in Table 2, and the volume average particle size and the specific surface area of the fillers are shown in Table 3.

In the same manner as in Examples B-1 to B-4, each composition was formed and cured to prepare a layer having a thickness of 500 μm. The coefficient of linear expansion and the coefficient of thermal conductivity of the prepared layers are shown in Table 4.

0.1 g of each of the compositions in Examples B-6 and B-10 was applied to a 10 mm square silicon substrate (film thickness: 500 μm) at 80° C. and cured on a hotplate at 165° C. for 2 hours. After completion of the curing reaction, the silicon substrate was cooled to room temperature, whereupon cracking did not occur on the cured layer of the composition and on the silicon substrate.

Using each of the compositions in Examples B-6, B-10 and B-11, bonding was conducted in the same manner as in Example B-2 to form a laminate. The electric resistance of a daisy chain in the interior of the laminate was measured by a digital multimeter, whereupon it was at most 30Ω.

With respect to each laminate, presence or absence of a void in between bumps in the bonded chip was observed using an ultrasonic imaging device (HYE-FOCUS II) manufactured by Hitachi Kenki FineTech Co., Ltd., whereupon no void was observed.

With respect to each of the compositions in Examples B-10 and B-11, the fracture toughness was evaluated, whereupon the fracture toughness of the sample obtained from the composition in Example B-10 was 1.8, and thus the sample had sufficient toughness for a layered semiconductor device and was evaluated as passed. Further, the fracture toughness of the sample obtained from the composition in Example B-11 was 2.2, and the sample had higher toughness and was evaluated as passed. [Comparative Examples B-1 and B-2]

A layer was formed in the same manner as in Examples B-1 to B-4 except that only inorganic filler (1) was used as the filler in Comparative Example B-1 or only inorganic filler (6) was used in Comparative Example B-2 each in an amount as identified in Table 4. The coefficient of linear expansion and the coefficient of thermal conductivity of the layers are shown in Table 4.

In the same manner as in Example B-2, 0.1 g of the composition in Comparative Example B-2 was applied to a 10 mm square silicon substrate (film thickness: 500 μm) at 80° C. and cured on a hotplate at 150° C. for 2 hours. After completion of the curing reaction, the silicon substrate was cooled to room temperature, whereupon significant cracking occurred on the silicon substrate.

Comparative Example B-3

Comparative Example B-3 was carried out in the same manner as in Examples B-1 to B-4 except that the amount of the epoxy compound (A-6) was as identified in Table 4. After the inorganic filler (1) and the inorganic filler (6) were added, the mixture was stirred by the rotary and revolutionary stirring machine at 2,000 rpm for 5 minutes, however, the epoxy compound and the filler could not be uniformly mixed by stirring.

TABLE 2

Physical properties of resin

| Resin | Type | Melt viscosity (Pa · s) | Epoxy equivalent |
|---|---|---|---|
| Epoxy compound | (A-1) | 0.01 | 171 |
| | (A-5) | 0.1 | 189 |
| | (A-6) | 3< | 950 |

TABLE 3

Physical properties of resin

| Type of filler | Filler | Volume average particle size (μm) | Specific surface area (m$^2$/g) |
|---|---|---|---|
| Silica | (1) | 3.5 | 4.4 |
| Silica | (2) | 1.6 | 6.5 |
| Aluminum nitride | (3) | 2 | 10 |
| Alumina | (6) | 3 | 0.5 |
| Magnesium oxide | (7) | 6 | 6 |
| Boron nitride | (8) | 1.6 | 9.7 |
| Alumina | (9) | 0.7 | 6 |

TABLE 4

Blend ratio of composition and evaluation results

| | Epoxy | | Curing agent | | | Filler | | | |
| | | | (1) | (2) | (3) | Inorganic filler (D-1) | | Inorganic filler (D-2) | |
| | Type | Amount (g) | Amount (g) | | | Type | Amount (g) | Type | Amount (g) |
|---|---|---|---|---|---|---|---|---|---|
| Example B-1 | (A-1) | 2 | 0.12 | — | — | (1) | 1.0 | (6) | 7.0 |
| Example B-2 | (A-1) | 2 | 0.12 | — | — | (1) | 2.0 | (6) | 6.0 |
| Example B-3 | (A-1) | 2 | 0.12 | — | — | (1) | 3.0 | (6) | 5.0 |
| Example B-4 | (A-1) | 3 | 0.24 | — | — | (1) | 5.0 | (8) | 2.0 |
| Example B-5 | (A-5) | 2 | — | 0.24 | 0.38 | (1) | 1.0 | (6) | 7.0 |
| Example B-6 | (A-5) | 3 | — | 0.36 | 0.57 | (1) | 2.0 | (6) | 5.0 |
| Example B-7 | (A-5) | 2 | — | 0.24 | 0.38 | (1) | 2.0 | (6) | 6.0 |
| Example B-8 | (A-5) | 2 | — | 0.24 | 0.38 | (1) | 3.0 | (6) | 5.0 |
| Example B-9 | (A-5) | 2.5 | — | 0.3 | 0.48 | (1) | 2.5 | (3) | 5.0 |
| Example B-10 | (A-5) | 3 | — | 0.36 | 0.57 | (1) | 5.0 | (8) | 2.0 |
| Example B-11 | (A-5) | 3 | — | 0.36 | 0.57 | (2) | 0.8 | (9) | 6.2 |
| Example B-12 | (A-5) | 2.5 | — | 0.3 | 0.48 | (1) | 1.5 | (3) | 6.0 |
| Example B-13 | (A-5) | 2.5 | — | 0.3 | 0.48 | (1) | 2.5 | (7) | 5.0 |
| Comparative Example B-1 | (A-1) | 4 | 0.24 | — | — | (1) | 6.0 | — | — |
| Comparative Example B-2 | (A-1) | 4 | 0.24 | — | — | — | — | (6) | 6.0 |
| Comparative Example B-3 | (A-6) | 3 | 0.18 | — | — | (1) | 1.0 | (6) | 7.0 |

| | Results | | | | | |
| | Coefficient of linear expansion (ppm/K) | Toughness K1c | Cracking (Breakage of substrate) | Glass transition temperature ° C. | Coefficient of thermal conductivity (W/mK) | Bonding property Continuity |
|---|---|---|---|---|---|---|
| Example B-1 | 28 | — | — | — | 1.3 | — |
| Example B-2 | 26 | — | ∘ (Nil) | — | 1.2 | ∘ |
| Example B-3 | 25 | — | — | — | 1 | — |
| Example B-4 | 28 | — | — | — | 1 | ∘ |
| Example B-5 | 28 | — | — | — | 1.3 | — |
| Example B-6 | 29 | — | ∘ (Nil) | — | 1 | ∘ |
| Example B-7 | 26 | — | — | — | 1.2 | — |
| Example B-8 | 25 | — | — | — | 1 | — |
| Example B-9 | 27 | — | — | — | 1.2 | — |
| Example B-10 | 22 | 1.8 | ∘ (Nil) | 114 | 1 | ∘ |
| Example B-11 | 32 | 2.2 | — | 106 | 1 | ∘ |
| Example B-12 | 29 | — | — | — | 1.5 | — |

TABLE 4-continued

| | Blend ratio of composition and evaluation results | | | | | |
|---|---|---|---|---|---|---|
| Example B-13 | 28 | — | — | — | 1.6 | — |
| Comparative Example B-1 | 34 | — | — | — | 0.5 | — |
| Comparative Example B-2 | 43 | — | x (Observed) | — | 0.8 | — |
| Comparative Example B-3 | Mixing impossible | — | — | — | — | — |

In the above Table, "—" represents that the material was not used or the evaluation was not carried out.

From the above results, the composition of the present invention has a high coefficient of thermal conductivity and a high glass transition temperature and thus excellent heat resistance, and is thereby capable of forming a suitable filling interlayer having a suitable coefficient of linear expansion and high toughness, to maintain stable bonding without cracks or separation even by various changes of environment, and further, it is capable of secure electric bonding of substrates, and it is possible to produce a favorable layered semiconductor device by the composition of the present invention.

Examples C-1 to C-7 and Comparative Examples C-1 to C-5

Component Blended

Components blended for the interlayer filler composition coating liquid used in the following examples are as follows.

<Epoxy Resin>

Epoxy resin (A-1): "YL6810" manufactured by Mitsubishi Chemical Corporation (epoxy equivalent: 171 g/equivalent)

Epoxy resin (A-2): "YL7805" manufactured by Mitsubishi Chemical Corporation (epoxy equivalent: 177 g/equivalent)

Epoxy resin (A-3): "YL7175" manufactured by Mitsubishi Chemical Corporation (epoxy equivalent: 487 g/equivalent)

Epoxy resin (A-4): "630" manufactured by Mitsubishi Chemical Corporation (epoxy equivalent: 96 g/equivalent)

<Inorganic Filler (D-1)>

Inorganic filler (4): agglomerated BN particles

Inorganic filler (8): boron nitride "R—BN" manufactured by NISSHIN REFRATECH CO., LTD. (coefficient of thermal conductivity: 3 W/(m·K) (thickness direction), 275 W/(m·K) (in-plane direction))

<Inorganic Filler (D-2)>

Inorganic filler (3): aluminum nitride "AlN—H" manufactured by Tokuyama Corporation Inorganic filler (5): alumina "AX-3" manufactured by Micron Co.

Inorganic filler (10): silica "SO-E6" manufactured by Admatechs Company Limited

<Curing Agent (C)>

Curing agent (1): 1-cyanoethyl-2-undecylimidazole "C11Z—CN" manufactured by SHIKOKU CHEMICALS CORPORATION <Flux (E)>

Adipic acid manufactured by Wako Pure Chemical Industries Ltd., special grade reagent <Dispersing Agent (F)>

"BYK-2155" manufactured by BYK Japan K.K., amine value: 48 (mg-KOH/g)

[Evaluation of Physical Properties and Characteristics]

(1) Melt Viscosity of Epoxy Resin

The melt viscosity was measured in the same manner as (1) melt viscosity of epoxy compound in the above series of Examples A.

(2) Particle Size of Boron Nitride Filler and Inorganic Filler

The interlayer filler composition coating liquid after stirring and mixing was dispersed in cyclohexanone, and the particle size was measured by a particle size distribution measuring apparatus "SALD-2200" manufactured by Shimadzu Corporation. From the obtained particle size distribution, the volume average particle size and the maximum particle size of the inorganic filler after grinding were obtained.

(3) Specific Surface Area of Inorganic Filler

The inorganic filler was pre-treated in a nitrogen gas flow at 250° C. for 15 minutes, and the specific surface area was measured by a BET one point method (adsorption gas: nitrogen) using Macsorb HM MODEL-1201 manufactured by Mountech Co., Ltd.

(4) Evaluation of Cracking 0.1 g of the interlayer filler composition compound was applied to a 10 mm square silicon substrate (thickness: 500 µm) and cured on a hotplate at 150° C. for 2 hours, and after the curing treatment, it was cooled to room temperature. A case where cracking occurred on the cured film of the interlayer filler or on the silicon substrate was described as "x", and a case where there was no change was described as "o" in Table 7.

(5) Coefficient of Thermal Conductivity of Cured Film

With respect to the cured film of the interlayer filler composition compound, the thermal diffusivity, the specific gravity and the specific heat were measured by the following apparatus, and these three measured values were multiplied to obtain the coefficient of thermal conductivity.

1) Thermal diffusivity: "ai-Phase Mobile 1µ" manufactured by ai-Phase Co., Ltd.

2) Specific gravity: "Balance XS-204" manufactured by Mettler-Toredo International Inc. (using solid specific gravity measuring kit)

3) Specific heat: "DSC320/6200" manufactured by Seiko Instruments Inc.

(6) Evaluation of Bonding Property

About 25 µL of the interlayer filler composition coating fluid was applied to a solider bump substrate made of silicon (CC80 Model I) manufactured by WALTS with heating at 80° C.

The solder bump substrate and an interposer (IP 80 Model I) manufactured by WALTS were bonded by heat pressing by heating up to 250° C. using Flip Chip Bonder (FC3000S) manufactured by Toray Engineering Co. Ltd., cooled and then cured at 150° C. for 2 hours to form a laminate. The electric resistance of a daisy chain in the interior of the laminate was measured by a digital multimeter, and a case with an electric resistance of at most 30Ω was evaluated as passed and described as "o" in Table 7.

(7) Evaluation of Void in Bonded Surface

With respect to a chip having a solder bump substrate made of silicon bonded to an organic interposer substrate via the interlayer filler composition, presence or absence of a void in between bumps in the bonded chip was evaluated using an ultrasonic imaging device (HYE-FOCUS II) manufactured by Hitachi Kenki FineTech Co., Ltd.

Example C-1

In a 125 ml stirring container, 1.25 g of epoxy resin (A-1), 0.75 g of (A-2), 0.25 g of (A-3) and 0.25 g of (A-4) were weighed, and dispersing agent (F1) was added in an amount of 2 parts by weight (0.15 g) based on the total amount of fillers, followed by stirring by a rotary and revolutionary stirring machine (ARV-310 manufactured by THINKY CORPORATION) at 2,000 rpm for one minute. To the mixture, inorganic filler (2) and inorganic filler (8) were added in amounts as identified in Table 7, followed by stirring by the rotary and revolutionary stirring machine at 2,000 rpm for 5 minutes. Further, curing agent (1) was added in an amount of 2 wt % based on the total amount of the resin and flux (E) was added in an amount of 4 wt % based on the total amount of the resin, followed by stirring with vacuum degassing by the rotary and revolutionary stirring machine under 1.2 kPa at 2,000 rpm for 5 minutes to obtain an interlayer filler compound. Physical properties of the epoxy resin used are shown in Table 5, and the volume average particle size and the specific surface area of the fillers are shown in Table 6.

0.1 g of the interlayer filler compound was applied to a 10 mm square silicon substrate (film thickness: 500 μm) at 80° C. and cured on a hotplate at 150° C. for 2 hours. After completion of the curing reaction, the silicon substrate chip was cooled to room temperature, whereupon cracking did not occur on the cured film of the interlayer filler and on the silicon substrate.

The interlayer filler compound was applied to a release film placed on a glass substrate, and on the film, a release film and a glass substrate were further placed via spacers to sandwich the interlayer filler compound, followed by pressing (pressure: 1 MPa) at 150° C. for 2 hours to form and cure the compound to obtain an interlayer filler composition film having a film thickness of 500 μm. The coefficient of thermal conductivity of the film measured was 1.3 W/(m·K).

Example C-2

The same operation as in Example C-1 was carried out except that as epoxy resins, 2.80 g of (A-1), 0.35 g of (A-3) and 0.35 g of (A-4) were used and that inorganic filler (8) and inorganic filler (10) were added in amounts as identified in Table 7. The results of evaluation of cracking and measurement of the coefficient of thermal conductivity are shown in Table 7.

About 25 μL of the interlayer filler compound was applied to a solder bump substrate made of silicon (CC80 Model I) manufactured by WALTS with heating to 80° C. The solder bump substrate and an interposer (IP80 Model I) manufactured by WALTS were bonded by heat pressing by heating up to 250° C. using Flip Chip Bonder (FC3000S) manufactured by Toray Engineering Co. Ltd., cooled and then cured at 150° C. for 2 hours to form a laminate. The electric resistance of a daisy chain in the interior of the laminate was measured by a digital multimeter, whereupon it was at most 30Ω.

With respect to the laminate, presence or absence of a void in between bumps in the bonded chip was evaluated using an ultrasonic imaging device (HYE-FOCUS II) manufactured by Hitachi Kenki FineTech Co., Ltd., whereupon no void was observed.

Examples C-3 to C-7

The same operation as in Example C-1 was carried out except that epoxy resin (A-1) was used and that inorganic filler (4) or (8) and inorganic filler (3), (5) or (10) were used in amounts as identified in Table 7. The results of evaluation of cracking and measurement of the coefficient of thermal conductivity are shown in Table 7.

Comparative Examples C-1 to C-5

The same operation as in Example C-1 was carried out except that epoxy resin (A-1) was used and that any of inorganic fillers (3), (5), (8) and (10) was used in amounts as identified in Table 7. The results of evaluation of cracking and measurement of the coefficient of thermal conductivity are shown in Table 7.

TABLE 5

Physical properties of resin

| Resin | Type | Melt viscosity (Pa · s) | Epoxy equivalent |
| --- | --- | --- | --- |
| Epoxy resin | (A-1) | 0.008 | 171 |
|  | (A-1)(A-3)(A-4) | 0.04 | 195 |
|  | (A-1)(A-2)(A-3)(A-4) | 0.01 | 197 |

TABLE 6

Physical properties of resin

| Filler | | Type | Volume average particle size (μm) | Specific surface area (m²/g) |
| --- | --- | --- | --- | --- |
| Inorganic filler (D-1) | (4) | Boron nitride | 4.1 | 26.7 |
|  | (8) | Boron nitride | 1.6 | 9.7 |
| Inorganic filler (D-2) | (3) | Aluminum nitride | 1.1 | 2.6 |
|  | (5) | Alumina | 3.5 | 0.6 |
|  | (10) | Silica | 2.0 | 2.0 |

TABLE 7

Blend ratio of composition and evaluation results

| | Resin | | Filler | | | |
| --- | --- | --- | --- | --- | --- | --- |
| | Epoxy | | Inorganic filler (D-1) | | Inorganic filler (D-2) | |
| | Type | Amount (g) | Type | Amount (g) | Type | Amount (g) |
| Example C-1 | (A-1)(A-2)(A-3)(A-4) | 2.5 | (8) | 2.0 | (10) | 5.5 |
| Example C-2 | (A-1)(A-3)(A-4) | 3.5 | (8) | 3.0 | (10) | 3.5 |
| Example C-3 | (A-1) | 2.0 | (8) | 3.0 | (10) | 5.0 |

TABLE 7-continued

| | Blend ratio of composition and evaluation results | | | | | |
|---|---|---|---|---|---|---|
| Example C-4 | (A-1) | 3.0 | (8) | 3.0 | (5) | 4.0 |
| Example C-5 | (A-1) | 2.0 | (8) | 3.0 | (5) | 5.0 |
| Example C-6 | (A-1) | 2.7 | (4) | 1.3 | (5) | 6.0 |
| Example C-7 | (A-1) | 3.0 | (8) | 2.0 | (3) | 5.0 |
| Comparative Example C-1 | (A-1) | 8.0 | (8) | 2.0 | — | — |
| Comparative Example C-2 | (A-1) | 7.0 | (8) | 3.0 | — | — |
| Comparative Example C-3 | (A-1) | 5.0 | — | — | (10) | 5.0 |
| Comparative Example C-4 | (A-1) | 5.0 | — | — | (5) | 5.0 |
| Comparative Example C-5 | (A-1) | 5.0 | — | — | (3) | 5.0 |

| | Results | | | |
|---|---|---|---|---|
| | Coefficient of linear expansion (ppm/K) | Cracking Breakage of substrate | Coefficient of thermal conductivity (W/mK) | Bonding property Continuity |
| Example C-1 | 25 | ○ | 1.3 | — |
| Example C-2 | 32 | ○ | 1.1 | ○ |
| Example C-3 | 18 | ○ | 1.5 | — |
| Example C-4 | 34 | ○ | 1.5 | — |
| Example C-5 | 25 | ○ | 2.3 | — |
| Example C-6 | 33 | ○ | 1.6 | — |
| Example C-7 | 32 | ○ | 1.8 | — |
| Comparative Example C-1 | 54 | x | 0.5 | — |
| Comparative Example C-2 | 50 | x | 0.7 | — |
| Comparative Example C-3 | 39 | x | 0.4 | — |
| Comparative Example C-4 | 47 | x | 0.6 | — |
| Comparative Example C-5 | 45 | x | 0.9 | — |

In the above Table, "—" represents that the material was not used or the evaluation was not carried out.

From the above results, the composition of the present invention has a high coefficient of thermal conductivity and is capable of forming a filling interlayer having a coefficient of linear expansion suitable to maintain stable bonding without cracks or separation even by various changes of environment, and is capable of secure electric bonding of substrates, and it is possible to produce a favorable layered semiconductor device by the composition of the present invention.

INDUSTRIAL APPLICABILITY

According to the present invention, it is possible to form a high quality filling interlayer without cracks or separation on a semiconductor device substrate and on the filling interlayer.

This application is a continuation of PCT Application No. PCT/JP2014/059139, filed on Mar. 28, 2014, which is based upon and claims the benefit of priority from Japanese Patent Application No. 2013-070084 filed on Mar. 28, 2013, Japanese Patent Application No. 2013-267644 filed on Dec. 25, 2013 and Japanese Patent Application No. 2014-060707 filed on Mar. 24, 2014. The contents of those applications are incorporated herein by reference in their entireties.

What is claimed is:

1. A composition comprising an epoxy compound (A) having a viscosity at 25° C. of at most 50 Pa·s, an amine compound (B) having a melting point or softening point of at least 80° C., and an amine compound (C) having a melting point or softening point of less than 80° C., wherein the proportion of the amine compound (C) is at least 1 part by weight and less than 40 parts by weight per 100 parts by weight of the total amount of the amine compound (B) and the amine compound (C),
wherein the composition further comprises an inorganic filler (D) which is at least one member selected from the group consisting of a particle of boron nitride having a specific crystal structure and a boron nitride agglomerated particle,
the particle of boron nitride having a specific crystal structure satisfies the condition of 0.70≤Lc/La,
wherein Lc denotes a crystallite size of a 002 plane and La denotes a crystallite size of a 100 plane,
the boron nitride agglomerated particles have a specific surface area of at least 10 m²/g and a total pore volume of at most 2.15 cm³/g, and
the surface of the boron nitride agglomerated particles is constituted by boron nitride primary particles having an average particle size of at least 0.05 μm and at most 1 μm.

2. The composition according to claim 1, wherein the amine compound (C) is a compound having an amino group directly bonded to a ring having aromaticity.

3. The composition according to claim 1, wherein the amine compound (C) is a compound represented by the following formula (1):

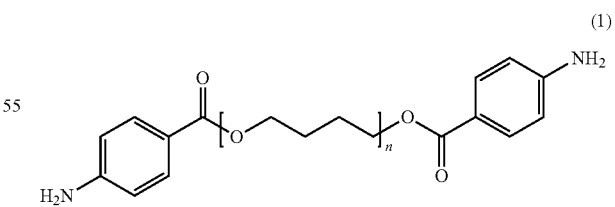

(1)

wherein n is an integer of from 1 to 10.

4. The composition according to claim 1, wherein the viscosity at 75° C. of the amine compound (C) is at most 50 Pa·s.

5. The composition according to claim 1, wherein the epoxy equivalent of the epoxy compound (A) is at least 150 g/equivalent and at most 650 g/equivalent.

6. The composition according to claim 1, which further contains at least one additional type of inorganic filler (D).

7. The composition according to claim 1, which contains a flux (E).

8. The composition according to claim 1, which contains a dispersing agent (F).

9. A layered semiconductor device comprising a plurality of substrates and an interlayer filler layer formed between the substrates, wherein at least one interlayer filler layer is a layer obtained by curing the composition as defined in claim 1.

10. The layered semiconductor device according to claim 9, wherein at least one of the substrates is a semiconductor substrate having a semiconductor device layer formed thereon.

11. The layered semiconductor device according to claim 10, which has a plurality of such semiconductor substrates.

12. A process for producing a layered semiconductor device, which comprises a step of forming a layer of the composition as defined in claim 1 on the surface of a semiconductor substrate having a semiconductor device layer formed thereon by a pre-application method, laminating the semiconductor substrate and another substrate and pressure-bonding them, and treating the laminate at from 120° C. to 180° C.

13. The process for producing a layered semiconductor device according to claim 12, wherein said another substrate is a semiconductor base having a semiconductor device layer formed thereon.

* * * * *